US012614867B2

(12) United States Patent
Fujimura et al.

(10) Patent No.: US 12,614,867 B2
(45) Date of Patent: Apr. 28, 2026

(54) POWER CONVERTER, INTER-COMPONENT CONNECTION SYSTEM, AND INTER-COMPONENT CONNECTION METHOD

(71) Applicant: Panasonic Intellectual Property Management Co., Ltd., Osaka (JP)

(72) Inventors: Motohiko Fujimura, Osaka (JP); Hiroshi Ogura, Tokyo (JP); Kazuhiro Nishikawa, Osaka (JP); Yoshihiro Kawakita, Osaka (JP); Hidetoshi Kitaura, Osaka (JP)

(73) Assignee: Panasonic Automotive Systems Co., Ltd., Kanagawa (JP)

( * ) Notice: Subject to any disclaimer, the term of this patent is extended or adjusted under 35 U.S.C. 154(b) by 307 days.

(21) Appl. No.: 18/516,437

(22) Filed: Nov. 21, 2023

(65) Prior Publication Data

US 2024/0088588 A1      Mar. 14, 2024

Related U.S. Application Data

(63) Continuation of application No. PCT/JP2022/000774, filed on Jan. 12, 2022.

(30) Foreign Application Priority Data

Jun. 10, 2021      (JP) ................................. 2021-097653

(51) Int. Cl.
*H01R 12/71*          (2011.01)
*H01R 13/631*        (2006.01)
(Continued)

(52) U.S. Cl.
CPC ......... *H01R 12/718* (2013.01); *H01R 13/631* (2013.01); *H01R 43/26* (2013.01);
(Continued)

(58) Field of Classification Search
CPC .... H01R 12/718; H01R 13/631; H01R 43/26; H05K 1/0269; H05K 2201/09063;
(Continued)

(56) References Cited

U.S. PATENT DOCUMENTS

| | | |
|---|---|---|
| 6,303,991 B1 | 10/2001 | Harper, Jr. et al. |
| 2001/0046144 A1 | 11/2001 | Murabayashi et al. |

(Continued)

FOREIGN PATENT DOCUMENTS

| | | | |
|---|---|---|---|
| JP | S562556 U | | 1/1981 |
| JP | H0688193 U | * | 12/1994 |

(Continued)

OTHER PUBLICATIONS

English translation of International Search Report, mailed Mar. 15, 2022, for PCT Patent Application No. PCT/JP2022/000774. (2 pages).

(Continued)

Primary Examiner — Abdullah A Riyami
Assistant Examiner — Nader J Alhawamdeh
(74) *Attorney, Agent, or Firm* — Seed Intellectual Property Law Group LLP

(57) ABSTRACT

A power converter includes first and second components on which male and female fitting members of each of a plurality of pairs of fitting members are arranged, with a pair of first alignment keys formed in the first and second components as reference positions. The first and second components are coupled to each other by the female fitting member clamping an insertion portion of the male fitting member inserted between first and second clamping portions of the female fitting member arranged so as to face each other in a state where the pair of first alignment keys are positionally aligned. The first and second clamping portions are each bent so as to form one of protrusions toward one of surfaces (Continued)

thereof facing each other. A gap is formed in a distal end portion of each of the first and second clamping portions.

11 Claims, 15 Drawing Sheets

(51) Int. Cl.
 *H01R 43/26* (2006.01)
 *H05K 1/02* (2006.01)
(52) U.S. Cl.
 CPC . *H05K 1/0269* (2013.01); *H05K 2201/09063* (2013.01); *H05K 2201/10318* (2013.01); *H05K 2201/10325* (2013.01)
(58) Field of Classification Search
 CPC .......... H05K 2201/10318; H05K 2201/10325; H05K 1/144; H05K 3/368
 See application file for complete search history.

(56) References Cited

U.S. PATENT DOCUMENTS

| | | |
|---|---|---|
| 2008/0101048 A1 | 5/2008 | Mishiro et al. |
| 2011/0122356 A1 | 5/2011 | Saimen |
| 2012/0129362 A1* | 5/2012 | Hampo .................. H05K 1/144 439/55 |
| 2020/0395697 A1* | 12/2020 | Chen ...................... H01R 12/73 |
| 2024/0088588 A1* | 3/2024 | Fujimura ............... H01R 43/26 |

FOREIGN PATENT DOCUMENTS

| | | |
|---|---|---|
| JP | 2000014128 A | 1/2000 |
| JP | 2001015198 A | 1/2001 |
| JP | 2002231353 A | 8/2002 |
| JP | 2002329943 A | 11/2002 |
| JP | 2004111810 A | 4/2004 |
| JP | 2008112869 A | 5/2008 |
| JP | 2011112666 A | 6/2011 |
| JP | 2020129435 A | 8/2020 |

OTHER PUBLICATIONS

Japanese Notice of Reasons for Refusal, mailed Oct. 29, 2024, for the Japanese Patent Application No. 2021-097653. (10 pages) (With English Machine Translation).
Notice of Reasons for Refusal, dated Jan. 13, 2026, for Japanese Patent Application No. 2025-022804. (9 pages) (with English Translation).
Japanese Decision to Grant a Patent, mailed Mar. 3, 2026, for Japanese Patent Application No. 2025-022804. (with English Machine Translation) (3 pages).

* cited by examiner (a)            (b)            (c)

| | ALIGNMENT KEY | BEFORE ALIGNMENT | AFTER ALIGNMENT |
|---|---|---|---|
| (a) | | | |
| (b) | | | |
| (c) | | | |
| (d) | | | |

(a)                                                    (b)

POWER CONVERTER, INTER-COMPONENT CONNECTION SYSTEM, AND INTER-COMPONENT CONNECTION METHOD

CROSS-REFERENCE TO RELATED APPLICATIONS

This application is a continuation of International Application No. PCT/JP2022/000774, filed on Jan. 12, 2022 which claims the benefit of priority of the prior Japanese Patent Application No. 2021-097653, filed on Jun. 10, 2021, the entire contents of which are incorporated herein by reference.

FIELD

The present disclosure relates to a power converter, an inter-component connection system, and an inter-component connection method.

BACKGROUND

Conventionally, a power converter mounted on an electric vehicle or the like includes a plurality of circuit boards on which a circuit configuration such as a DC/DC converter or an inverter is mounted. Such a power converter is required to be downsized, for example, from a viewpoint of mountability on a vehicle.

Under such circumstances, there is known a technique of miniaturizing a power converter while maintaining a mounting area on a plurality of circuit boards by stacking the plurality of circuit boards. In such a power converter, electrical connection between components may be performed by fitting a fitting portion such as a connector disposed in a component such as each circuit board. A related technique is disclosed in JP 2000-014128 A.

However, in an assembly step of a power converter, when fitting position accuracy between fitting members in each fitting portion is low, there is a possibility that the fitting portion is not appropriately fitted, and a failure occurs in electrical connection between components.

The present disclosure provides a power converter, an inter-component connection system, and an inter-component connection method, capable of improving fitting position accuracy between fitting members in a fitting portion that electrically connects components to each other.

SUMMARY

A power converter according to the present disclosure includes a first component, a second component, and a plurality of pairs of fitting members. In the first component, one alignment key of a pair of first alignment keys is formed. In the second component, the other alignment key of the pair of first alignment keys is formed. The plurality of pairs of fitting members each includes a male fitting member and a female fitting member. The male fitting member has an insertion portion. The female fitting member has a first clamping portion and a second clamping portion arranged so as to face each other. In each of the plurality of pairs of fitting members, the male fitting member is arranged on one of the first component and the second component, with the first alignment key as a reference position, and the female fitting member is arranged on the other of the first component and the second component, with the first alignment key as a reference position. The first component and the second component are coupled to each other by the female fitting member clamping the insertion portion of the male fitting member inserted between the first clamping portion and the second clamping portion in each of the plurality of pairs of fitting members in a state where the pair of first alignment keys are positionally aligned. The first clamping portion and the second clamping portion are each bent so as to form one of protrusions toward one of surfaces thereof facing each other. A gap is formed in a distal end portion of each of the first clamping portion and the second clamping portion.

BRIEF DESCRIPTION OF THE DRAWINGS

FIG. 16 is a diagram illustrating another example of the alignment key according to the embodiment;

DETAILED DESCRIPTION

Figure 1:
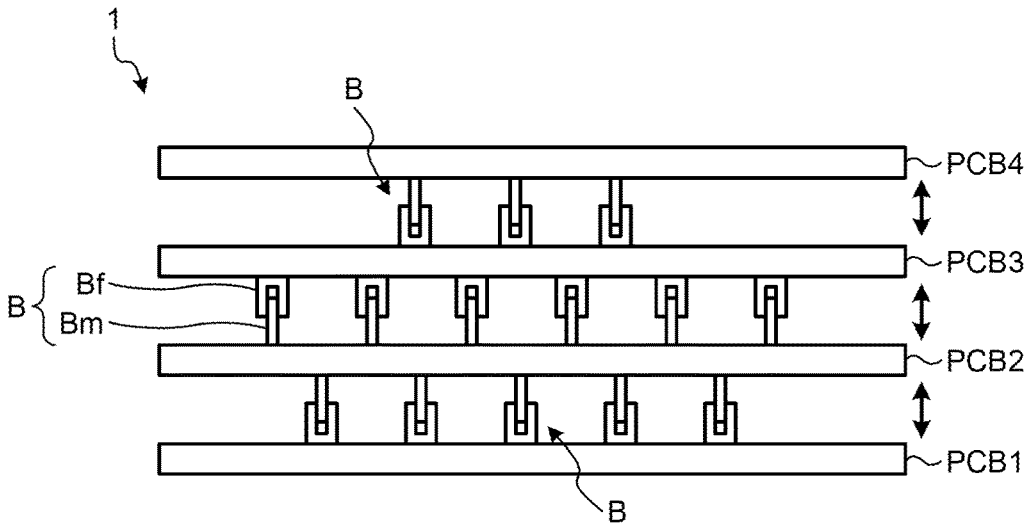
FIG. 1 is a schematic cross-sectional view illustrating an example of a layered structure of a plurality of printed circuit boards in a power converter according to an embodiment.

Hereinafter, an embodiment of an inter-component connection structure, a power converter, an inter-component connection system, and an inter-component connection method according to the present disclosure will be described with reference to the drawings.

Note that the inter-component connection structure according to the present disclosure is a structure of connecting any components to be connected, such as an electronic component, a circuit board, and a board unit, to each other. The component to be connected is a component constituting a power converter, such as a charger. As an example, the inter-component connection structure is a connection structure between circuit boards. As another example, the inter-component connection structure is a connection structure between an electronic component and a circuit board or a board unit. As another example, the inter-component connection structure is a connection structure between a circuit board and a board unit. As another example, the inter-component connection structure is a connection structure between electronic components. As another example, the inter-component connection structure is a connection structure between board units. Note that a cooling plate may be used as the component to be connected.

For example, the electronic component is a component such as a semiconductor element, a semiconductor module, a magnetic body, a capacitor, or a circuit breaker. The semiconductor module is constituted by, for example, a plurality of semiconductor elements. Here, the magnetic body is a transformer, a transformer-integrated printed board, a transformer, a reactor, or a choke. The circuit breaker is a relay or a fuse.

For example, the circuit board is a printed circuit board (PCB). The printed circuit board is, for example, a glass epoxy board formed using an aluminum alloy or a copper alloy as a base material. Note that the circuit board may be a circuit board included in a magnetic component such as a transformer, a transformer, a reactor, or a choke. This magnetic component includes, for example, a board on which a conductor pattern forms a winding, and has a function as a magnetic component by forming a closed magnetic path through a magnetic core inside and outside the winding formed on the board. In this case, the electronic component can be expressed as a printed board transformer or a transformer-integrated printed board.

For example, the board unit is a plurality of coupled circuit boards. Note that, in the board unit, the plurality of circuit boards may be coupled to each other by the inter-component connection structure according to the present disclosure, or may be coupled to each other with an adhesive, a screw, a bolt, or the like. In addition, the coupled circuit boards may be electrically connected to each other or may be insulated from each other. Note that the board unit may be a circuit board on which an electronic component is mounted. In this case, the electronic component and the circuit board may be electrically connected to each other, insulated from each other, or only thermally connected to each other.

In the following description, the inter-component connection according to the present disclosure will be described using inter-board connection that electrically connects a plurality of printed circuit boards to each other as an example.

As an example, a power converter according to an embodiment is an in-vehicle charger that is mounted on an electric vehicle or the like, converts alternating-current power supplied from a power supply (external power supply) into direct-current power of a predetermined voltage, and outputs the direct-current power after the conversion to a battery such as a lithium ion battery. Such a power converter includes a plurality of circuit boards on which a circuit configuration such as a DC/DC converter or an inverter is mounted. Note that the inter-component connection structure according to the present disclosure may be applied to connection between a DC/DC converter module or an inverter module and a circuit board.

FIG. 1 is a schematic cross-sectional view illustrating an example of a layered structure of a plurality of printed circuit boards in a power converter 1 according to an embodiment. FIG. 1 illustrates a first circuit board PCB1, a second circuit board PCB2, a third circuit board PCB3, and a fourth circuit board PCB4 among the plurality of circuit boards included in the power converter 1.

The first circuit board PCB1, the second circuit board PCB2, the third circuit board PCB3, and the fourth circuit board PCB4 are each a printed circuit board. Note that, in the following description, a plurality of sets each including one pair of fitting members B may be referred to as a plurality of pairs of fitting members B. In addition, the pair of fitting members B may be referred to as a fitting portion.

The first circuit board PCB1 is coupled to the second circuit board PCB2 by a plurality of pairs of fitting members B. The second circuit board PCB2 is coupled to each of the first circuit board PCB1 and the third circuit board PCB3 by a plurality of pairs of fitting members B. The third circuit board PCB3 is coupled to the second circuit board PCB2 and the fourth circuit board PCB4 by a plurality of pairs of fitting members B. The fourth circuit board PCB4 is coupled to the third circuit board PCB3 by a plurality of pairs of fitting members B. As a result, the boards are electrically connected to one another via the plurality of pairs of fitting members B.

Note that only some of the plurality of circuit boards included in the power converter 1 can be printed circuit boards. For example, at least one circuit board of the first circuit board PCB1, the second circuit board PCB2, the third circuit board PCB3, and the fourth circuit board PCB4 may be a printed circuit board. In addition, the connection between the circuit boards by the pair of fitting members B does not necessarily have to be an electrical connection.

Note that the embodiment mainly exemplifies a case where two circuit boards are electrically coupled to each other by the plurality of pairs of fitting members B.

As described above, in the power converter 1 according to the embodiment, two adjacent circuit boards of at least two circuit boards to be stacked are coupled to each other by the plurality of pairs of fitting members B. Each of the plurality of pairs of fitting members B includes a male fitting member Bm and a female fitting member Bf. That is, the plurality of pairs of fitting members B are a plurality of sets of pairs of fitting members B. Each of the plurality of pairs of fitting members B, that is, the pair of fitting members B is a set of the male fitting member Bm and the female fitting member Bf. Here, one of each of the plurality of pairs of fitting members B is arranged on each of main surfaces of the two circuit boards to be stacked, which face each other.

Figure 6:
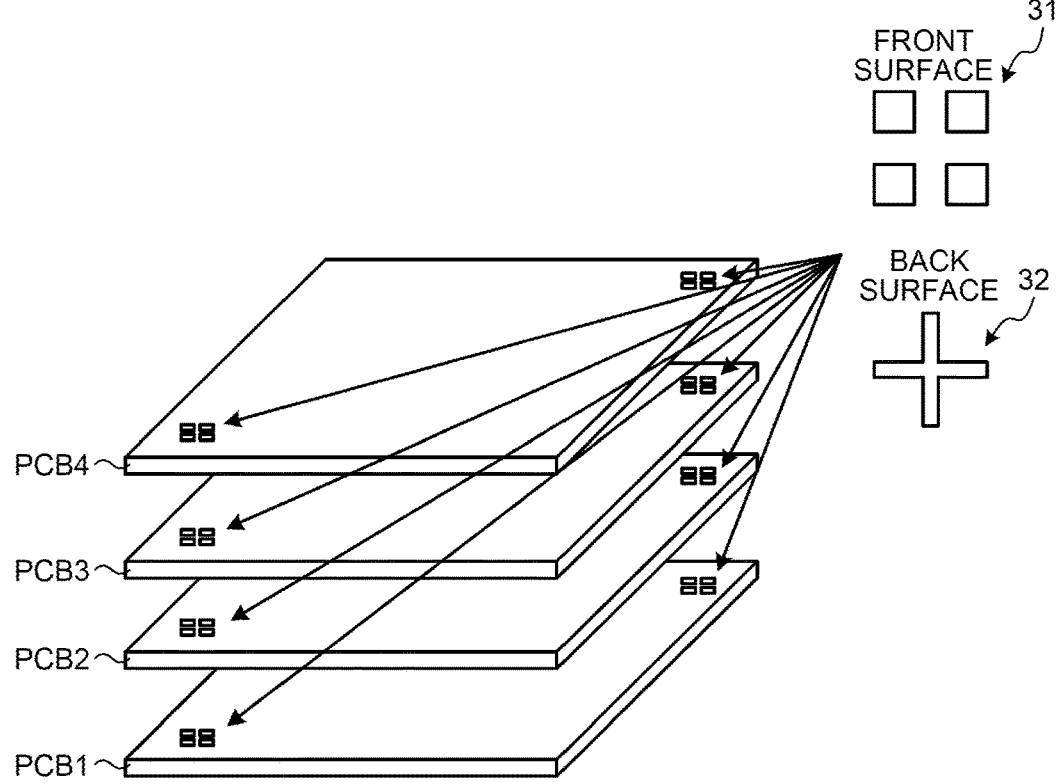
FIG. 6 is a schematic perspective view illustrating an example of the plurality of printed circuit boards in FIG. 1, each of which has an alignment key.

The male fitting member Bm or the female fitting member Bf is arranged on each circuit board with the alignment key 31, 32 as a geometric reference position, for example, with the alignment key 31, 32 as an origin (see FIG. 6).

Specifically, as illustrated in FIG. 1, in each of the plurality of pairs of fitting members B, the male fitting member Bm is arranged on one of the two circuit boards to be stacked, and the female fitting member Bf is arranged on the other of the two circuit boards to be stacked.

Which one of the male fitting member Bm and the female fitting member Bf is arranged on each of the plurality of circuit boards can be arbitrarily determined. As an example, as illustrated in FIG. 1, only one of the male fitting member Bm and the female fitting member Bf is arranged on each of two circuit boards to be coupled by fitting of a plurality of pairs of fitting members B. As another example, at least one male fitting member Bm and at least one female fitting member Bf are arranged on each of two circuit boards to be coupled by fitting of a plurality of pairs of fitting members B. In this case, in each of the circuit boards, the male fitting member Bm can be arranged on one main surface, and the female fitting member Bf can be arranged on the other main surface. Alternatively, in each of the circuit boards, both the male fitting member Bm and the female fitting member Bf can be arranged on one main surface.

Two or more circuit boards may be coupled to one main surface in each of the circuit boards.

The male fitting member Bm is a blade-shaped connector (plug) on an insertion side. The male fitting member Bm can also be expressed as a flat plug blade. The female fitting member Bf is a connector (receptacle) on a side to be inserted. The female fitting member Bf can also be expressed as a blade receiving spring.

Figure 2:
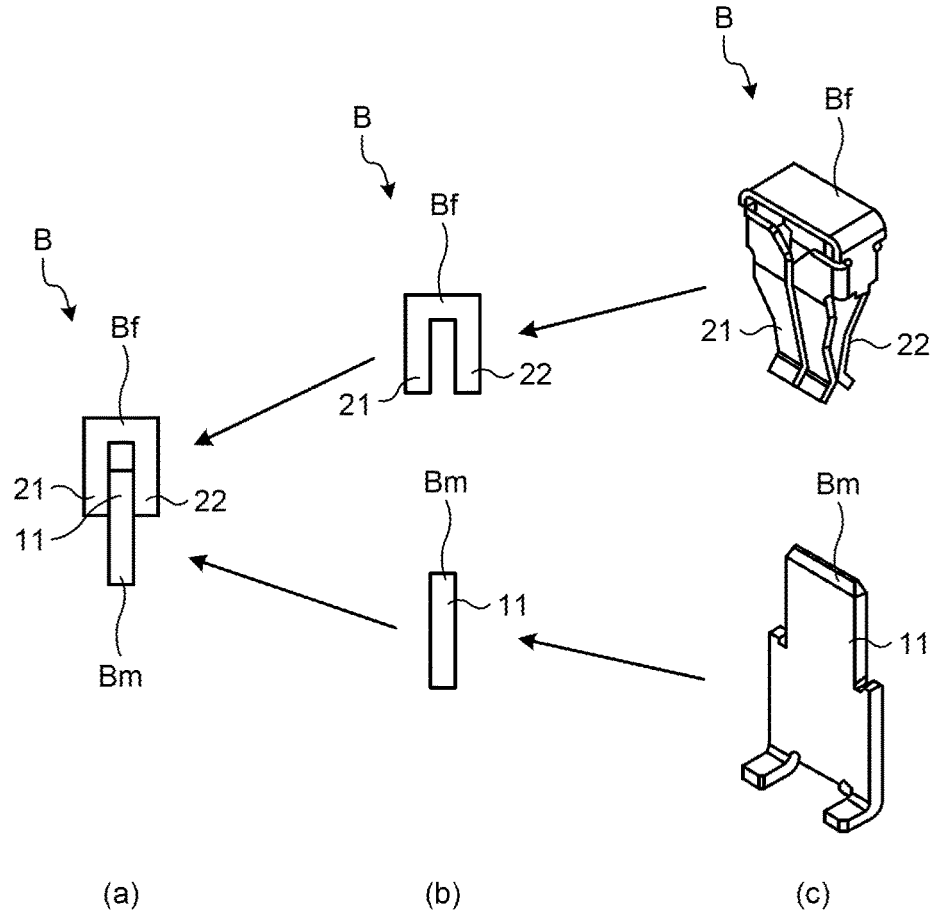
FIG. 2 is a schematic view illustrating an example of a configuration of a pair of fitting members in FIG. 1.
Figure 3:
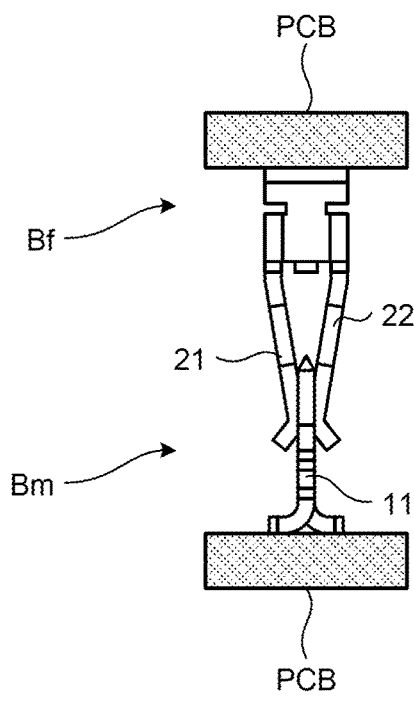
FIG. 3 is a schematic cross-sectional view illustrating an example of a fitted state of the pair of fitting members in FIG. 1.

FIG. 2 is a schematic view illustrating an example of a configuration of the pair of fitting members B in FIG. 1. FIG. 3 is a schematic cross-sectional view illustrating an example of a fitted state of the pair of fitting members B in FIG. 1. In (a) of FIG. 2 and FIG. 3, an example of a fitted state of the pair of fitting members B is illustrated. In (b) of FIG. 2, each of the male fitting member Bm and the female fitting member Bf similarly to FIG. 1 is schematically illustrated. In (c) of FIG. 2 and FIG. 3, each of the male fitting member Bm and the female fitting member Bf is specifically illustrated.

An insertion portion 11 of the male fitting member Bm mounted on the circuit board PCB is inserted into a receiving portion 20 of the female fitting member Bf. Specifically, the insertion portion 11 is inserted so as to expand a gap between a first clamping portion 21 and a second clamping portion 22 while being in contact with the first clamping portion 21 and the second clamping portion 22. As illustrated in (a) of FIG.

2 and FIG. 3, the female fitting member Bf clamps the insertion portion 11 of the male fitting member Bm inserted between the first clamping portion 21 and the second clamping portion 22, whereby a circuit board PCB on which the female fitting member Bf is arranged and a circuit board PCB on which the male fitting member Bm is arranged are coupled to each other. Note that a length of inserting the male fitting member Bm into the female fitting member Bf, that is, an insertion height can be appropriately set according to a distance between boards to be coupled, and the like.

Figure 4:
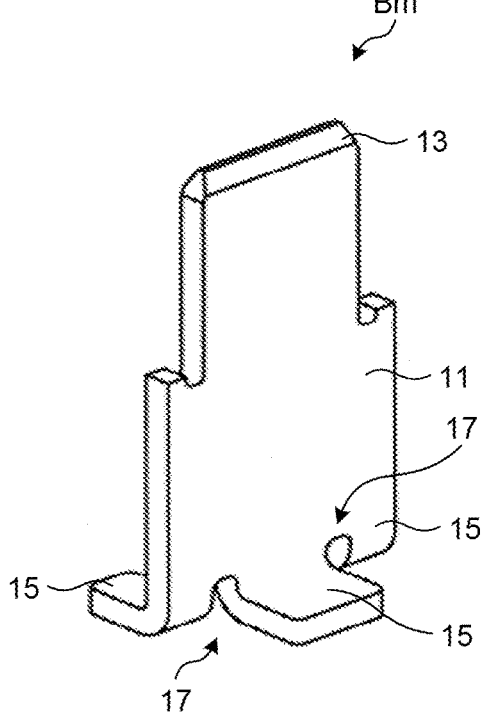
FIG. 4 is a schematic perspective view illustrating an example of a configuration of a male fitting member in FIG. 1.

FIG. 4 is a schematic perspective view illustrating an example of a configuration of the male fitting member Bm in FIG. 1. The insertion portion 11 of the male fitting member Bm has a substantially flat plate shape. A distal end portion 13 of the insertion portion 11 is chamfered and has a smaller thickness as it is closer to a distal end. As a result, the insertion portion 11 can be easily inserted into the receiving portion 20 of the female fitting member Bf. A connecting portion 15 of the insertion portion 11 is each of parts on a rear end side obtained by dividing the insertion portion 11 into three by a gap 17. The connecting portion 15, that is, each of parts on a rear end side obtained by dividing the insertion portion 11 is bent in a direction substantially perpendicular to the insertion portion 11. The connecting portion 15 is soldered to a predetermined position on the PCB substrate, and electrically connects the insertion portion 11 and wiring on the PCB substrate to each other. The insertion portion 11 and the connecting portion 15 can be formed by, for example, bending a single metal plate.

Note that the number of divisions of the insertion portion 11 of the male fitting member Bm on the rear end side can be arbitrarily designed to be two or more. As an example, the larger the length of the insertion portion 11, the larger the number of divisions.

Figure 5:
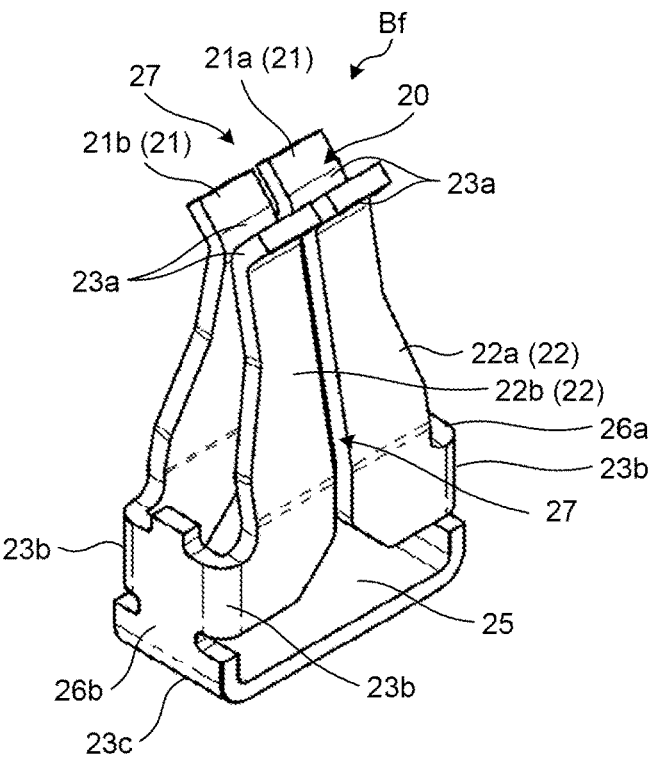
FIG. 5 is a schematic perspective view illustrating an example of a configuration of a female fitting member in FIG. 1.

FIG. 5 is a schematic perspective view illustrating an example of a configuration of the female fitting member Bf in FIG. 1. The female fitting member Bf clamps the insertion portion 11 of the male fitting member Bm inserted into the receiving portion 20. The female fitting member Bf is formed by, for example, bending a single metal plate. The female fitting member Bf has a substantially Y-shape or X-shape in which a distal end side is opened when viewed from a side surface side, that is, a side of a first base portion 26*a* or a second base portion 26*b*.

Specifically, the female fitting member Bf has the first clamping portion 21 and the second clamping portion 22. The first clamping portion 21 and the second clamping portion 22 are arranged so as to face each other. A surface of the first clamping portion 21 facing the second clamping portion 22 and a surface of the second clamping portion 22 facing the first clamping portion 21 form the receiving portion 20. That is, the first clamping portion 21 and the second clamping portion 22 face each other via the receiving portion 20. The female fitting member Bf clamps the insertion portion 11 of the male fitting member Bm inserted into the receiving portion 20 between the first clamping portion 21 and the second clamping portion 22. The first clamping portion 21 is bent at a first bent portion 23*a* into a shape protruding toward the facing second clamping portion 22. Similarly, the second clamping portion 22 is bent at the first bent portion 23*a* into a shape protruding toward the facing first clamping portion 21. In other words, the first clamping portion 21 and the second clamping portion 22 are bent at the first bent portions 23*a* so as to form protrusions toward surfaces facing each other. The first bent portion 23*a* of the first clamping portion 21 and the first bent portion 23*a* of the second clamping portion 22 are separated from each other via the receiving portion 20. A distance between the first bent portion 23*a* of the first clamping portion 21 and the first bent portion 23*a* of the second clamping portion 22 is smaller than the thickness of the insertion portion 11 of the male fitting member Bm.

Each of the first clamping portion 21 and the second clamping portion 22 has a gap 27 from a distal end side to a rear end side. That is, each of the first clamping portion 21 and the second clamping portion 22 is divided into two by the gap 27. In other words, the distal end portion of the female fitting member Bf is divided into four by the gap 27. Specifically, the first clamping portion 21 has a first elastic portion 21*a* and a second elastic portion 21*b* divided by the gap 27. Similarly, the second clamping portion 22 has a third elastic portion 22*a* and a fourth elastic portion 22*b* divided by the gap 27. Here, it can also be expressed that the first elastic portion 21*a* and the second elastic portion 21*b* are separated from each other via the gap 27. Similarly, it can also be expressed that the third elastic portion 22*a* and the fourth elastic portion 22*b* are separated from each other via the gap 27.

Note that FIG. 5 illustrates the female fitting member Bf divided into four by the gap 27, the present disclosure is not limited thereto. The number of divisions by the gap 27 may be five or more. Note that the number of divisions of the first clamping portion 21 is preferably equal to the number of divisions of the second clamping portion 22, and the number of divisions by the gap 27 is, for example, an even number of six or more. A relative rotational position shift between the pair of fitting members B described later may occur in any direction. Therefore, by making the number of divisions of the first clamping portion 21 equal to the number of divisions of the second clamping portion 22, it is possible to expand a geometric allowable range of the fitting portion regardless of a direction of the rotational position shift.

Each of the first elastic portion 21*a* and the third elastic portion 22*a* extends from the first base portion 26*a*. In other words, each of the first elastic portion 21*a* and the third elastic portion 22*a* is continuously and integrally linked to the first base portion 26*a* via a second bent portion 23*b*. Each of the second elastic portion 21*b* and the fourth elastic portion 22*b* extends from the second base portion 26*b*. In other words, each of the second elastic portion 21*b* and the fourth elastic portion 22*b* is continuously and integrally linked to the second base portion 26*b* via the second bent portion 23*b*. Each of the first base portion 26*a* and the second base portion 26*b* extends from a connecting portion 25 to a printed circuit board. In other words, each of the first base portion 26*a* and the second base portion 26*b* is continuously and integrally linked to the connecting portion 25 via a third bent portion 23*c*.

Therefore, each of the first elastic portion 21*a*, the second elastic portion 21*b*, the third elastic portion 22*a*, and the fourth elastic portion 22*b* corresponds to a shape obtained by dividing the first clamping portion 21 or the second clamping portion 22, and can be therefore deformed independently according to a contact state with the insertion portion 11.

Note that the male fitting member Bm and the female fitting member Bf are each made of a metal material. As an example, the male fitting member Bm and the female fitting member Bf are made of copper, a copper alloy including brass, aluminum, or an aluminum alloy.

Conductor plating is applied to a part or whole of a surface region of the male fitting member Bm and the female fitting member Bf. As the conductor plating, for example, tin plating, silver plating, or gold plating can be appropriately used.

Here, tin has a property of being easily alloyed with nickel used for a base of the male fitting member Bm and the female fitting member Bf. When an ambient temperature rises, alloying of tin and nickel proceeds, and a resistance value becomes 1 [me] or more. On the other hand, alloying of silver or gold with nickel hardly proceeds, but use of silver or gold increases cost. When a contact resistance between the male fitting member Bm and the female fitting member Bf is large, a temperature rises at a contact portion between the male fitting member Bm and the female fitting member Bf. Therefore, in the power converter 1 according to the embodiment, the contact resistance at the contact portion between the male fitting member Bm and the female fitting member Bf is set to 1 [me] or less. In other words, a contact resistance between the insertion portion 11 of the male fitting member Bm and a protrusion of the first clamping portion 21 or the second clamping portion 22 in a state where the pair of fitting members B is fitted is set to 1 [me] or less.

The magnitude of the contact resistance is defined by "contact pressure", "material (such as tin on a surface)", and "contact area". Therefore, in the power converter 1 according to the embodiment, as an example, the contact resistance is adjusted to 1 [me] or less by adjusting elastic forces of the four elastic portions of the female fitting member Bf. In other words, in the female fitting member Bf according to the embodiment, the elastic forces of the four elastic portions are designed such that the contact resistance is 1 [me] or less. Note that the elastic forces of the four elastic portions depend on, for example, a material (base material) of the female fitting member Bf and a shape thereof.

Note that the insertion portion 11 of the male fitting member Bm according to the embodiment has a substantially flat plate shape. In addition, the female fitting member Bf according to the embodiment is fitted with the male fitting member Bm by clamping the inserted substantially flat plate-shaped insertion portion 11. As a result, the inter-board connection structure according to the embodiment can increase a contact area between the pair of fitting members B as compared with, for example, an inter-board connection structure achieved using a male fitting member having a pin-shaped insertion portion, and thus can reduce the contact resistance. The decrease in the contact resistance between the pair of fitting members B contributes to suppression of heat generation and power loss in the pair of fitting members B, improvement of the degree of freedom regarding the shape and material of the female fitting member Bf, simplification of determination of a connection state, and the like.

For example, when the diameter of the pin shape and the thickness of the flat plate shape are the same, since the width of the flat plate shape can be arbitrarily set, a contact area of the flat plate-shaped male fitting member Bm with the female fitting member Bf can be made larger than that of a pin-shaped male fitting member having the same length. In addition, for example, when the cross-sectional areas of the pin shape and the flat plate shape in a cross section parallel to a board are the same, the area of a main surface of the flat plate shape can be made larger than the surface area of the pin shape having the same length by appropriately setting the thickness and width of the flat plate shape. That is, the flat plate-shaped male fitting member Bm can have a larger contact area with the female fitting member Bf than the pin-shaped male fitting member having the same length.

Here, the thickness of the insertion portion 11 is the size of the insertion portion 11 in a left-right direction in the state illustrated in FIG. 1. The length of the insertion portion 11 is the size of the insertion portion 11 in an up-down direction in the state illustrated in FIG. 1. The width of the insertion portion 11 is the size of the insertion portion 11 in a direction perpendicular to a paper surface in the state illustrated in FIG. 1.

Note that the present disclosure exemplifies the substantially flat plate-shaped male fitting member Bm having the insertion portion 11, but the present disclosure is not limited thereto. For example, the male fitting member Bm may have the insertion portion 11 having a substantially cylindrical shape such as a pin shape. Even in this case, the plurality of elastic portions of the female fitting member Bf according to the embodiment can be deformed independently according to a contact state with the substantially cylindrical insertion portion 11. Note that the plurality of elastic portions of the female fitting member Bf can be arranged, for example, in an annular shape so as to be fitted with the male fitting member Bm by clamping the inserted substantially cylindrical insertion portion 11.

Note that an insulating portion is disposed on an outer peripheral portion of the female fitting member Bf. As an example, the insulating portion is an insulator layer formed on the outer peripheral portion of the female fitting member Bf. The insulator layer may be formed by applying an insulator to the outer peripheral portion of the female fitting member Bf, or may be formed by pasting an insulating film made of an insulator on the outer peripheral portion of the female fitting member Bf. As an example, the insulator is a resin. Here, the outer peripheral portion of the female fitting member Bf is a surface region of the female fitting member Bf excluding a region of the first clamping portion 21 on a side facing the second clamping portion 22, a region of the second clamping portion 22 on a side facing the first clamping portion 21, and a region of the connecting portion 25 in contact with a printed circuit board. As a result, when a failure occurs in fitting of the pair of male fitting members Bm and female fitting members Bf due to a position shift between the insertion portion 11 and the receiving portion 20, the connection failure can be detected by electrical inspection. Here, the electrical inspection is measurement of a resistance value via a contact portion between the male fitting member Bm and the female fitting member Bf.

FIG. 6 is a schematic perspective view illustrating an example of the plurality of printed circuit boards in FIG. 1, each of which has an alignment key. As illustrated in FIG. 6, the alignment key 31, 32 is formed on each main surface of each of the plurality of circuit boards according to the present embodiment. For example, each of the circuit boards has the alignment key 31 on a front surface side and the alignment key 32 on a back surface side. For example, in the example illustrated in FIG. 6, the alignment key 31 is formed on a main surface of the first circuit board PCB1 on the second circuit board PCB2 side. In addition, the alignment key 32 is formed on a main surface of the second circuit board PCB2 on the first circuit board PCB1 side. That is, the pair of alignment keys 31 and 32 are formed on surfaces of the first circuit board PCB1 and the second circuit board PCB2, which face each other, respectively. In addition, the pair of alignment keys 31 and 32 are formed at facing positions on two circuit boards to be coupled in a state where the two circuit boards are coupled to each other.

Note that the alignment key 31, 32 may be formed or does not have to be formed on a main surface of the first circuit board PCB1 opposite to the second circuit board PCB2 and a main surface of the fourth circuit board PCB4 opposite to the third circuit board PCB3. That is, in each of the plurality of circuit boards, the alignment key 31, 32 is formed at least on a main surface facing another circuit board to be coupled.

The alignment key 31, 32 is a mark used as a geometric reference position such as an origin position when the male fitting member Bm or the female fitting member Bf is arranged on each circuit board.

In addition, the alignment key 31, 32 is a mark for position adjustment used at the time of alignment in a flow of coupling the circuit boards to each other. The alignment key 31, 32 may also be referred to as an alignment mark. The alignment key 31, 32 has a pattern shape formed on each of two circuit boards to be coupled. Here, each of the pair of alignment keys 31 and 32 for alignment of two circuit boards to be coupled is an example of a first alignment key.

Here, although details will be described later, the alignment is to perform positioning and alignment of each circuit board in a flow of coupling circuit boards to each other on the basis of the alignment key 31, 32. The positioning and alignment of each circuit board refer to moving a stage 62 (see FIG. 9) holding each circuit board to move each circuit board above the other circuit board to be coupled in the vertical direction.

Figure 7:
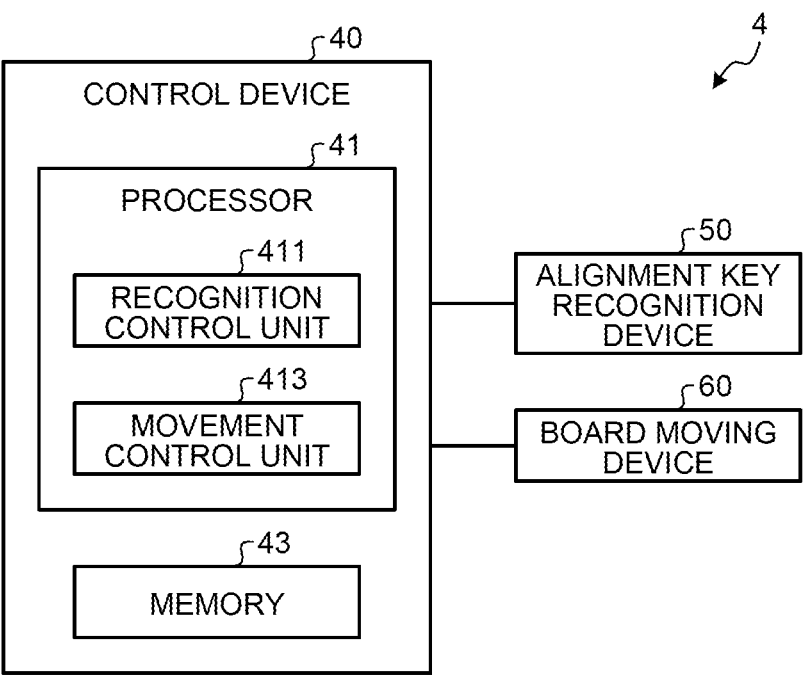
FIG. 7 is a block diagram illustrating an example of a configuration of an inter-component connection system according to the embodiment.
Figure 8:
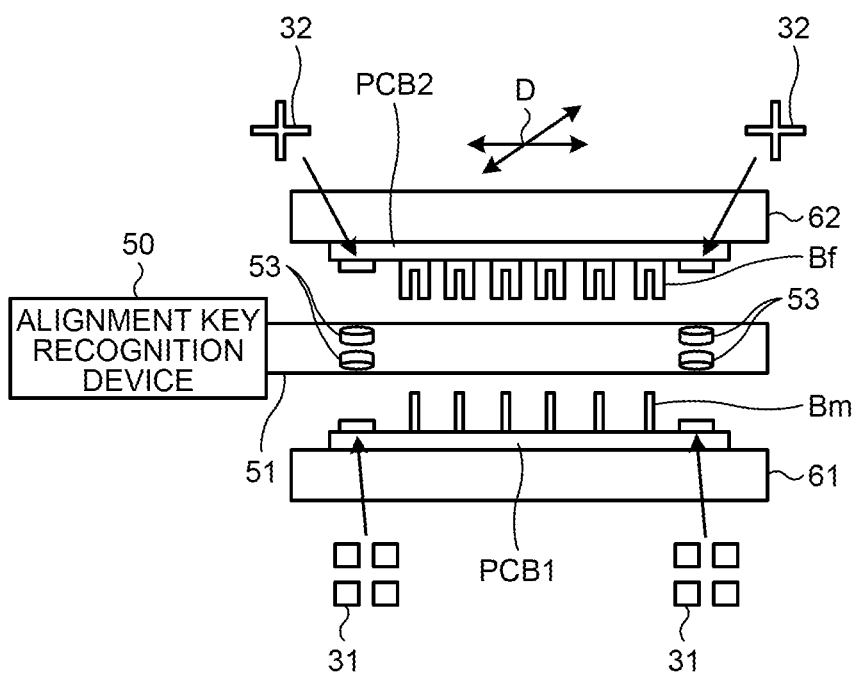
FIG. 8 is a schematic view illustrating an example of the configuration of the inter-component connection system according to the embodiment.
Figure 9:
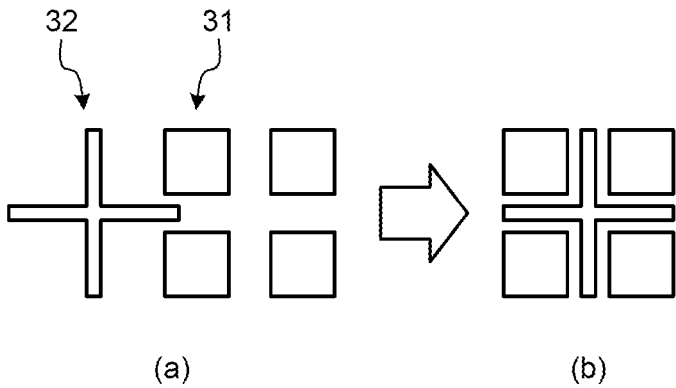
FIG. 9 is a diagram for describing an example of a positional relationship of alignment keys before and after alignment between components in inter-component connection according to the embodiment.
Figure 10:
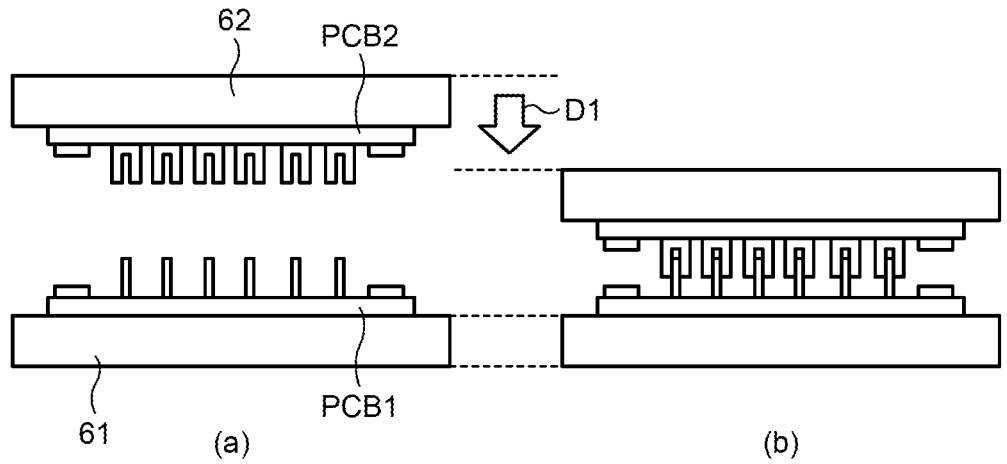
FIG. 10 is a diagram for describing an example of a step of fitting between components in the inter-component connection according to the embodiment.

FIG. 7 is a block diagram illustrating an example of a configuration of an inter-component connection system 4 according to the embodiment. FIG. 8 is a schematic view illustrating an example of the configuration of the inter-component connection system according to the embodiment. FIG. 9 is a diagram for describing an example of a positional relationship of alignment keys 31 and 32 before and after alignment between components in inter-component connection according to the embodiment. FIG. 10 is a diagram for describing an example of a step of fitting between components in the inter-component connection according to the embodiment.

The inter-component connection system 4 is a system that connects components of the power converter 1, such as an in-vehicle charger, to each other. That is, the inter-component connection system 4 can be used in an assembly step of the power converter 1. As illustrated in FIG. 7, the inter-component connection system 4 includes a control device 40, an alignment key recognition device 50, and a board moving device 60.

The control device 40 includes a processor 41 and a memory 43.

The processor 41 controls entire operation of the control device 40. As the processor 41, various processors such as a central processing unit (CPU), a graphics processing unit (GPU), an application specific integrated circuit (ASIC), and a field programmable gate array (FPGA) can be appropriately used.

The memory 43 stores various data and programs used by the control device 40. As the memory 43, various storage media and storage devices such as a read only memory (ROM), a hard disk drive (HDD), a solid state drive (SSD), and a flash memory can be appropriately used. In addition, the memory 43 further includes a random access memory (RAM) that temporarily stores working data. Note that as the memory 43, an external storage device connected to the control device 40 via an electric communication line may be used.

The control device 40 has functions as a recognition control unit 411 and a movement control unit 413. The control device 40 implements functions as the recognition control unit 411 and the movement control unit 413, for example, by the processor 41 executing an inter-component connection program loaded in the memory 43.

The recognition control unit 411 controls operation of the alignment key recognition device 50. For example, the recognition control unit 411 moves a support member 51 on which a plurality of cameras 53 is mounted and inserts the support member 51 between two circuit boards to be coupled. The recognition control unit 411 recognizes the alignment keys 31 and 32 formed on the two circuit boards to be coupled, respectively, with the plurality of cameras 53. The recognition control unit 411 outputs recognition results of the alignment keys 31 and 32 to the movement control unit 413.

The movement control unit 413 calculates a movement amount of the stage 62 on which one of the two circuit boards to be coupled is mounted with respect to a stage 61 on which the other of the two circuit boards to be coupled is mounted on the basis of the recognition results of the alignment keys 31 and 32 by the recognition control unit 411. For example, when the recognized alignment keys 31 and 32 are not positionally aligned as illustrated in (a) of FIG. 9, the movement control unit 413 calculates the movement amount of the stage 62 on the basis of the shift direction and shift amount of the recognized alignment keys 31 and 32. That is, as illustrated in (b) of FIG. 9, the movement control unit 413 calculates the movement amount of the stage 62 with a state in which the alignment keys 31 and 32 are positionally aligned as a target position.

Figure 11:
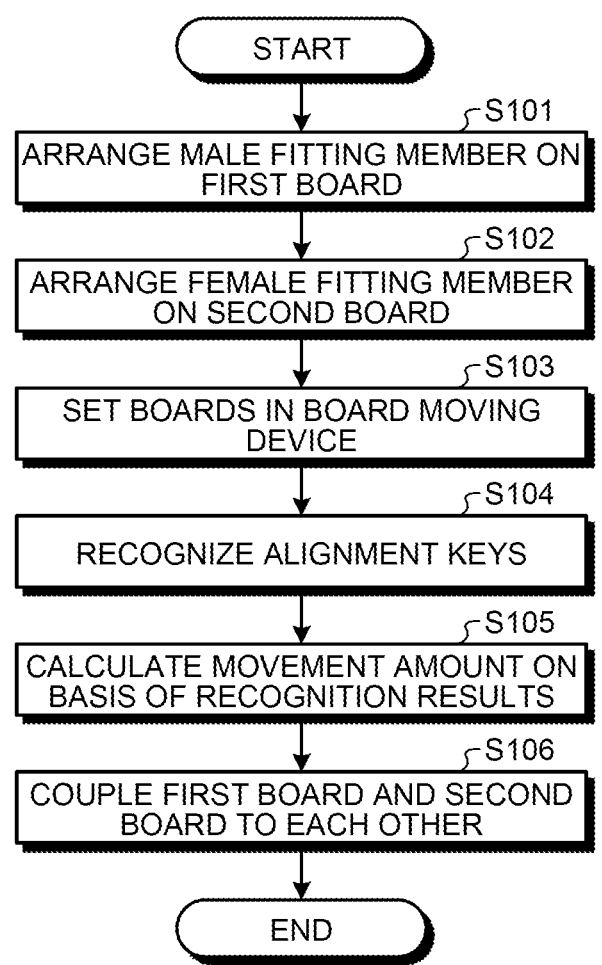
FIG. 11 is a flowchart illustrating an example of a flow of the inter-component connection according to the embodiment.

In addition, the movement control unit 413 moves the stage 62 on the basis of the calculated movement amount to positionally align the two circuit boards to be coupled, thus completing alignment. Thereafter, as illustrated in FIG. 11, the movement control unit 413 moves the stage 62 in a vertical direction D1 so as to approach the stage 61, and couples the two circuit boards to each other by fitting the plurality of pairs of fitting members B.

Note that positionally aligning two circuit boards means, for example, changing a relative position such that the alignment key 31 fits in a gap of the alignment key 32, but the present disclosure is not limited thereto. For example, positionally aligning two circuit boards may mean changing relative positions such that the alignment keys 31 and 32 are separated by a predetermined distance from each other and orientations of the alignment keys 31 and 32 coincide with each other.

The alignment key recognition device 50 is a device that recognizes the alignment keys 31 and 32 formed on the two circuit boards to be coupled, respectively, in an assembly step of a circuit board. As illustrated in FIG. 8, the alignment key recognition device 50 includes the support member 51 and the plurality of cameras 53. The plurality of cameras 53 is disposed in the support member 51. The plurality of cameras 53 includes at least two cameras 53 disposed at facing positions of two circuit boards, respectively, when the support member 51 is inserted between the two circuit boards. These cameras 53 can image the alignment keys 31 and 32 formed on facing circuit boards. The positions of the plurality of cameras 53 in the support member 51 are stored in the memory 43 or the like in advance. Note that the number and arrangement of the plurality of cameras 53 only need to be appropriately determined according to the circuit boards on which the alignment keys 31 and 32 are formed.

Note that arrangement of the alignment keys 31 and 32 on the first circuit board PCB1 and the second circuit board PCB2 may be different from arrangement of the alignment keys 31 and 32 on the second circuit board PCB2 and the third circuit board PCB3. In this case, different alignment key recognition devices 50 may be used depending on arrangement of the alignment keys 31 and 32 on two circuit boards to be coupled. In addition, the positions of the plurality of cameras 53 may be changeable according to arrangement of the alignment keys 31 and 32 on two circuit boards to be coupled.

In the example illustrated in FIG. 8, the plurality of cameras 53 recognizes the alignment key 31 formed on the second circuit board PCB2 side of the first circuit board PCB1 and the alignment key 32 formed on the first circuit board PCB1 side of the second circuit board PCB 2. In the example illustrated in FIG. 8, a camera 53 that recognizes the alignment key 31 formed on the second circuit board PCB2 side of the first circuit board PCB1 and a camera 53 that recognizes the alignment key 32 formed on the first circuit board PCB1 side of the second circuit board PCB2 are arranged such that imaging axes thereof are located on the same axis.

The board moving device 60 is a device that performs alignment of two circuit boards to be coupled in an assembly step of a circuit board. As illustrated in FIG. 8, the board moving device 60 includes the stages 61 and 62 that hold two circuit boards to be coupled, respectively. The stages 61 and 62 are constructed such that their surfaces facing each other are parallel to each other. The stage 61 is, for example, a fixed stage. The stage 62 is, for example, a movable stage. The stage 62 is, for example, a three-axis stage movable in up-down and left-right directions. The stage 62 may be able to tilt a circuit board to be held.

In the example illustrated in FIG. 8, the stage 61 of the board moving device 60 holds the first circuit board PCB1. The stage 62 holds the second circuit board PCB2 so as to be movable in a horizontal direction D. The board moving device 60 performs alignment of the second circuit board PCB2 with respect to the first circuit board PCB1 by moving the stage 62 in parallel to the stage 61. In addition, as illustrated in FIG. 10, the board moving device 60 vertically moves the stage 62 with respect to the stage 61 to couple the second circuit board PCB2 to the first circuit board PCB1.

Note that the board moving device 60 does not have to include the stage 61 configured as a fixed stage. In this case, instead of the stage 61, the board moving device 60 may use a housing of the power converter 1 such as an aluminum die casting or a stainless steel plate constituting the power converter 1. Alternatively, the board moving device 60 is implemented as a device that aligns the second circuit board PCB2 with respect to the first circuit board PCB1 coupled to the housing. That is, in the present disclosure, the stage 61 can be appropriately replaced with one of a pair of components to be connected in an assembly step of the power converter 1. Note that the point that the other of the pair of components to be connected is moved by the stage 62 is similar even when the stage 61 is used or even when a component such as a housing of the power converter 1 is used instead of the stage 61.

Hereinafter, an example of a flow of inter-component connection according to the embodiment will be described with reference to the drawings. FIG. 11 is a flowchart illustrating an example of the flow of the inter-component connection according to the embodiment. Here, as illustrated in FIGS. 8 and 10, a case where the second circuit board PCB2 is coupled to the first circuit board PCB1 will be described as an example.

First, the male fitting member Bm is arranged on a main surface of the first circuit board PCB1 on the second circuit board PCB2 side with the alignment key 31 as a reference (S101). The female fitting member Bf is arranged on a main surface of the second circuit board PCB2 on the first circuit board PCB1 side with the alignment key 32 as a reference (S102). In this manner, by arranging the male fitting member Bm or the female fitting member Bf with the alignment keys 31 and 32 as reference positions, it is possible to positionally align the circuit boards by performing alignment using the alignment keys 31 and 32.

Next, the circuit boards are set in the board moving device 60 such that main surfaces of the circuit boards on coupling sides face each other (S103). Specifically, the first circuit board PCB1 is held by the stage 61. The second circuit board PCB2 is held by the stage 62.

Thereafter, the recognition control unit 411 inserts the support member 51 between the two circuit boards to be coupled, and recognizes the alignment keys 31 and 32 formed on the two circuit boards to be coupled, respectively, with the plurality of cameras 53 (S104). After recognizing the alignment keys 31 and 32, the recognition control unit 411 removes the support member 51 from between the two circuit boards to be coupled.

After the support member 51 is moved from between the two circuit boards to be coupled, the movement control unit 413 moves the stage 62 with respect to the stage 61 on the basis of recognition results of the alignment keys 31 and 32 by the recognition control unit 411, and couples the first circuit board PCB1 and the second circuit board PCB2 to each other (S203). Specifically, the movement control unit 413 calculates a movement amount of the stage 62 related to the alignment on the basis of the recognition results of the alignment keys 31 and 32 by the recognition control unit 411. In addition, the movement control unit 413 moves the stage 62 in parallel on the basis of the calculated movement amount to complete the alignment. After the alignment is completed, the movement control unit 413 causes the stage 62 to approach the stage 61 to cause each of the plurality of pairs of fitting members B to be fitted.

Note that, in step S203, after a sensor detects contact between the male fitting member Bm and the female fitting member Bf, the movement control unit 413 pushes one printed circuit board into the other printed circuit board to form a fixed state of a layered structure. As the sensor, for example, a sensor that measures a resistance value via a contact portion between the male fitting member Bm and the female fitting member Bf can be used. The female fitting member Bf has an elastic force (spring force) on a side opposite to an insertion direction of the insertion portion 11 of the male fitting member Bm. Therefore, when the plurality of male fitting members Bm is simultaneously pushed into the plurality of female fitting members Bf, respectively, some of the male fitting members Bm may be detached from the receiving portions 20 of the female fitting members Bf, respectively. Therefore, in this step, after a reliable fitting state is once created, one printed circuit board is further pushed into the other printed circuit board, thereby achieving good fitting. Here, the reliable fitting state refers to, for example, a steady state in which the insertion portion 11 is pushed into the receiving portion 20 by about 1 mm.

As described above, the male fitting member Bm and the female fitting member Bf mounted on two circuit boards, respectively, are fitted to each other, whereby the two circuit boards are coupled to each other. However, when the male fitting member Bm or the female fitting member Bf is mounted on a circuit board, the male fitting member Bm or the female fitting member Bf may be arranged to be shifted from intended positions. In such a case, there is a possibility that the pair of fitting members B are not appropriately fitted to each other, and a connection failure between the boards occurs. In addition, even when each of the male fitting member Bm and the female fitting member Bf is mounted in a predetermined arrangement, there is a possibility that the pair of fitting members B are not appropriately fitted to each other depending on a positional accuracy at the time of assembly, and a connection failure between the boards occurs.

Under such circumstances, in the inter-component connection structure according to the embodiment, the male fitting member Bm and the female fitting member Bf are arranged, with the alignment keys 31 and 32 formed on the circuit boards as reference positions. in addition, alignment of the two circuit boards to be coupled is performed on the basis of recognition results of the alignment keys 31 and 32. In this manner, by forming the alignment keys 31 and 32 on the circuit boards, the plurality of pairs of fitting members B can be appropriately fitted to each other by alignment of the circuit boards based on the recognition results of the alignment keys 31 and 32. The alignment key recognition device 50 recognizes the alignment keys 31 and 32 formed at predetermined positions on the circuit boards by the plurality of cameras 53 arranged such that imaging axes thereof are coaxial at positions corresponding to arrangement of the alignment keys 31 and 32. According to this configuration, even when the sizes of two circuit boards to be coupled are different from each other, alignment of the two circuit boards to be coupled can be performed with the alignment keys 31 and 32.

As described above, according to the inter-component connection method of the embodiment, a fitting position accuracy between fitting members in a fitting portion that electrically connects components to each other can be improved. As a result, a plurality of circuit boards can be appropriately stacked, and therefore it is possible to miniaturize the power converter 1.

Hereinafter, modifications of the inter-component connection structure, the power converter, the inter-component connection system, and the inter-component connection method according to the embodiment will be described with reference to the drawings. Note that, in the following description, a difference from the above-described embodiment or a difference between the modifications will be mainly described, and redundant description will be appropriately omitted.

First Modification

In the above-described embodiment, the case where imaging axes of a camera 53 that recognizes an alignment key of a circuit board on the stage 61 and a camera 53 that recognizes an alignment key of a circuit board on the stage 62 are coaxial has been exemplified, but the present disclosure is not limited thereto.

Figure 12:
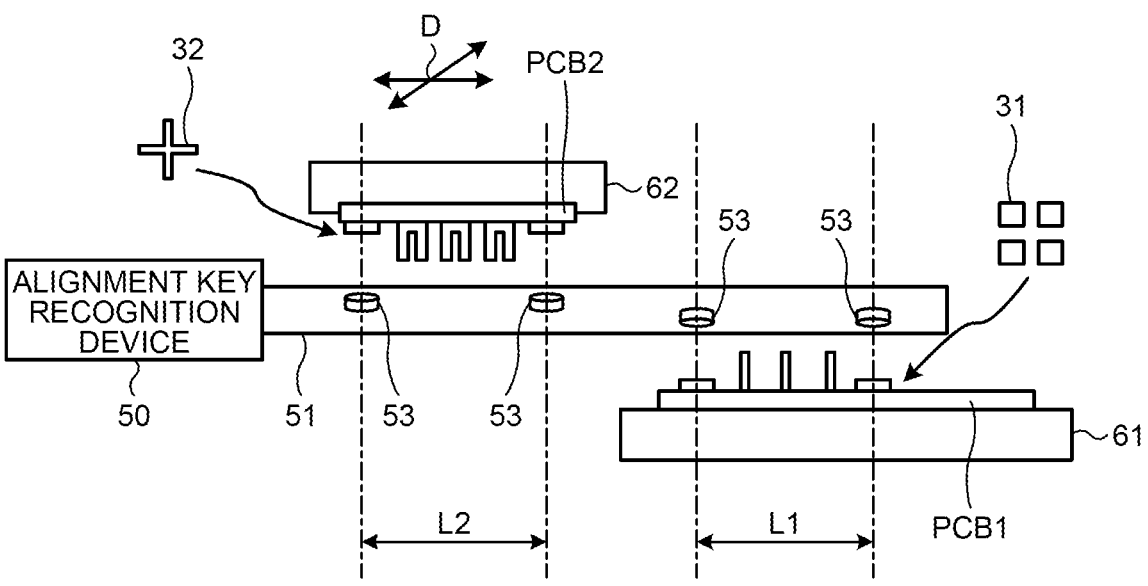
FIG. 12 is a schematic view illustrating another example of the configuration of the inter-component connection system according to the embodiment.
Figure 13:
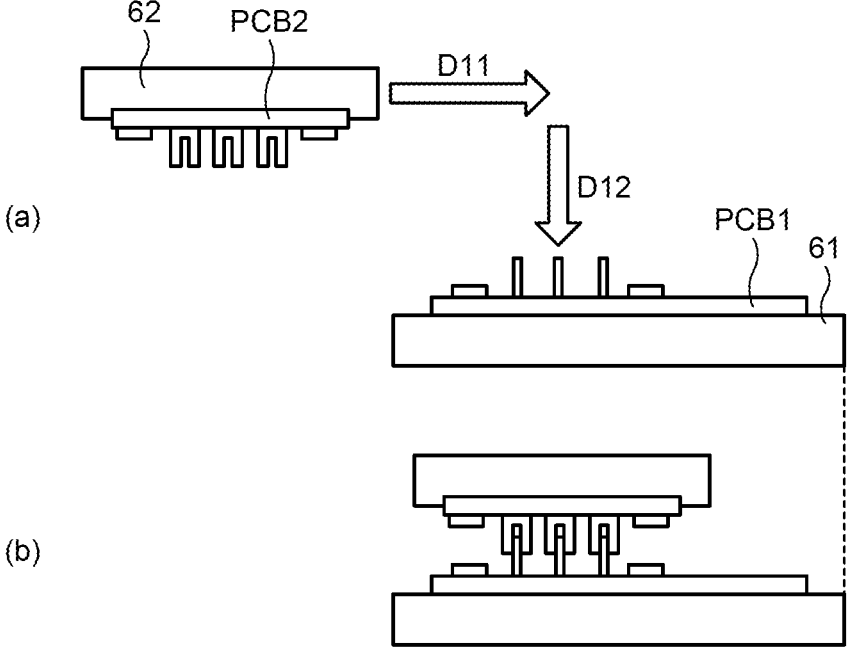
FIG. 13 is a diagram for describing another example of the step of fitting between components in the inter-component connection according to the embodiment.

FIG. 12 is a schematic view illustrating another example of the configuration of the inter-component connection system 4 according to First Modification. FIG. 13 is a diagram for describing another example of a step of fitting between components in inter-component connection according to First Modification.

As illustrated in FIG. 12, in the alignment key recognition device 50 according to the present modification, an imaging axis of a camera 53 that recognizes an alignment key of a circuit board on the stage 61 and an imaging axis of a camera 53 that recognizes an alignment key of a circuit board on the stage 62 are not located on the same axis. Here, a distance L1 between imaging axes of two cameras 53 that recognize the alignment key of the circuit board on the stage 61 is equal to a distance L2 between imaging axes of two cameras 53 that recognize the alignment key of the circuit board on the stage 62. As a result, even when the imaging axes of the plurality of cameras 53 facing the stage 61 and the imaging axes of the plurality of cameras 53 facing the stage 62 are not coaxial, the corresponding alignment keys 31 and 32 can be recognized.

Note that, similarly to the above-described embodiment, the positions of the alignment keys of two circuit boards to be coupled only need to correspond to each other, and as illustrated in FIGS. 12 and 13, the sizes of the two circuit boards to be coupled may be different from each other.

As illustrated in FIG. 13, similarly to the above-described embodiment, the board moving device 60 according to the present modification moves the stage 62 in a horizontal direction D11 on the basis of a recognition result of the alignment key recognition device 50 under control of the control device 40 to complete the alignment. In addition, the board moving device 60 moves the stage 62 in a vertical direction D12 under control of the control device 40 to couple the first circuit board PCB1 and the second circuit board PCB2 to each other.

Even with this configuration, similar effects to those of the above-described embodiment can be obtained.

Second Modification

In the embodiment and First Modification described above, the case where one alignment key recognition device 50 recognizes an alignment key of a circuit board on the stage 61 and an alignment key of a circuit board on the stage 62 has been exemplified, but the present disclosure is not limited thereto.

Figure 14:
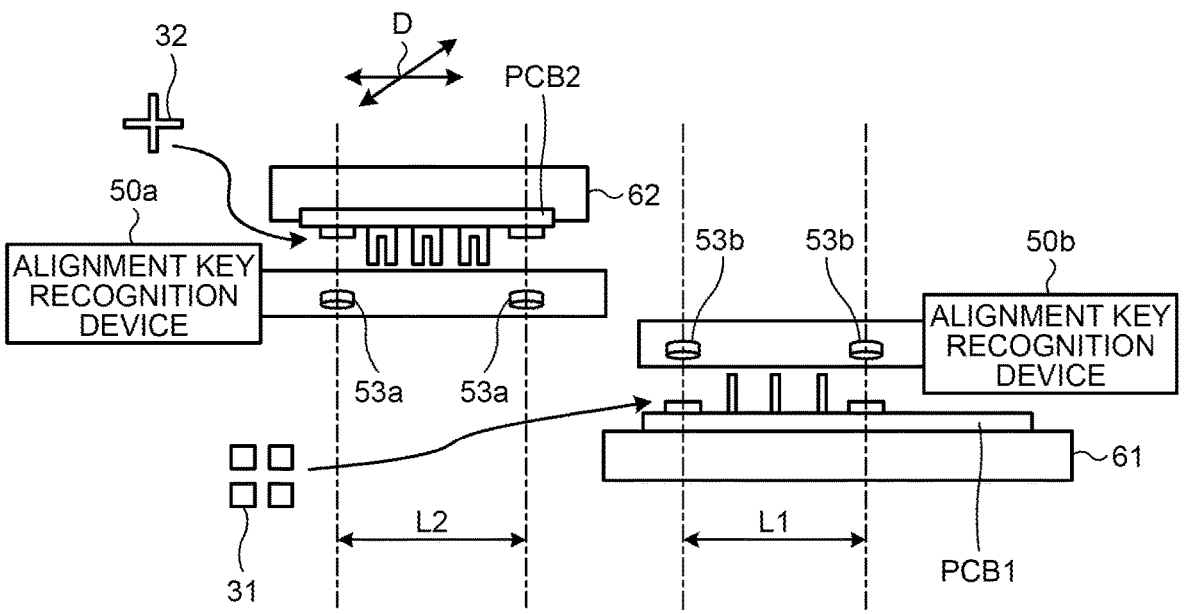
FIG. 14 is a schematic view illustrating another example of the configuration of the inter-component connection system according to the embodiment.

FIG. 14 is a schematic view illustrating another example of the configuration of the inter-component connection system 4 according to the embodiment. As illustrated in FIG. 14, the inter-component connection system 4 according to the present modification includes an alignment key recognition device 50a and an alignment key recognition device 50b. The alignment key recognition device 50a recognizes an alignment key of a circuit board on the stage 61. The alignment key recognition device 50b recognizes an alignment key of a circuit board on the stage 62.

Note that the number of alignment key recognition devices 50 may be three or more. For example, the second circuit board PCB2 and the third circuit board PCB3 may be coupled to one main surface of the first circuit board PCB1. In such a case, three alignment key recognition devices 50 that recognize alignment keys of the first circuit board PCB1, the second circuit board PCB2, and the third circuit board PCB3, respectively, may be used.

Even with these configurations, similar effects to those of the above-described embodiment can be obtained.

Third Modification

In the embodiment and Modifications described above, the case where the plurality of cameras 53 is inserted between two circuit boards to be coupled has been exemplified, but the present disclosure is not limited thereto.

Figure 15:
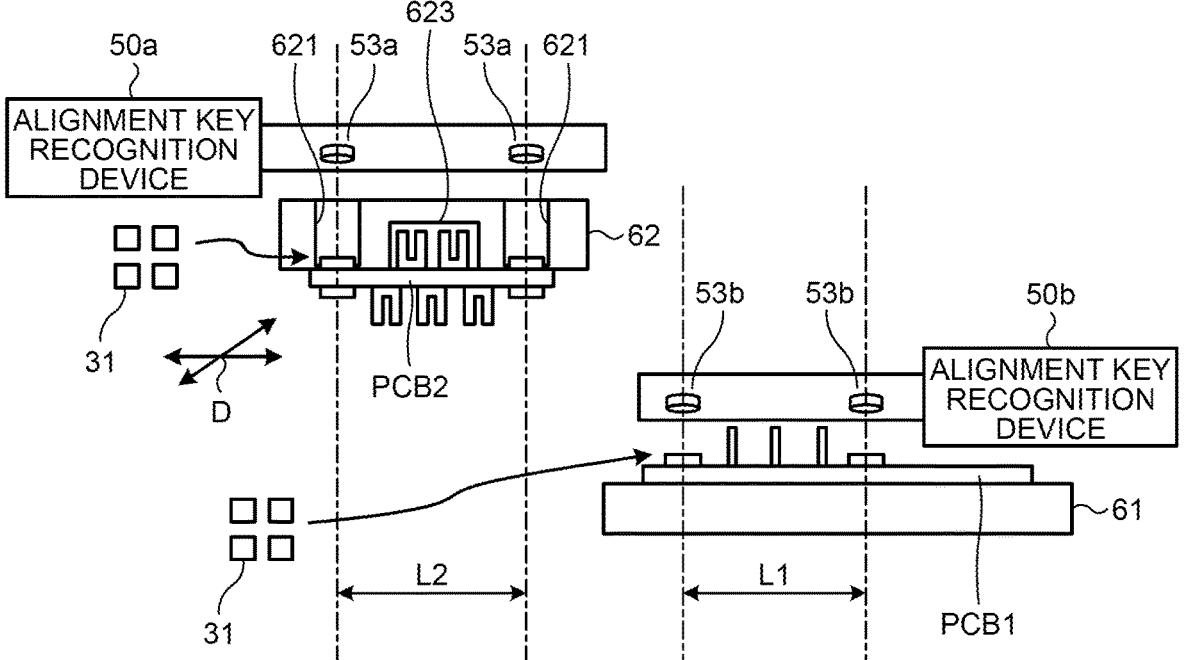
FIG. 15 is a schematic view illustrating another example of the configuration of the inter-component connection system according to the embodiment.

FIG. 15 is a schematic view illustrating another example of the configuration of the inter-component connection system 4 according to the embodiment. As illustrated in FIG. 15, in the inter-component connection system 4 according to the present modification, the stage 62 has a transmission portion 621. The transmission portion 621 is formed at a position facing the alignment key 31 of a circuit board held by the stage 62. The transmission portion 621 only needs to be able to recognize the alignment key 31 by the camera 53 via the stage 62, and may be formed by a through hole or may be made of a transparent member such as glass.

The stage 62 according to the present modification has a recess 623 on a side of a circuit board to be held. The recess 623 is formed at a position facing the male fitting member Bm or the female fitting member Bf disposed on the circuit board held by the stage 62.

The movement control unit 413 according to the present modification calculates a movement amount of the stage 62 on the basis of the alignment key 31 of the first circuit board PCB1 and the alignment key 31 of the second circuit board PCB2. Here, the alignment key 31 of the first circuit board PCB1 and the alignment key 31 of the second circuit board PCB2 have the same pattern shape, and are an example of a pair of alignment keys formed on surfaces of the first circuit board PCB1 and the second circuit board PCB2 facing the same side. Note that, similarly, alignment can also be performed using the alignment keys 32.

According to this configuration, in addition to similar effects to those of the above-described embodiment, the following effects can be obtained. For example, when a plurality of circuit boards is stacked, at least one of the male fitting member Bm and the female fitting member Bf is disposed on each of main surfaces of a circuit board forming an intermediate layer. Under such circumstances, according to the configuration of the present modification, the alignment key 31 can be recognized without inserting the support member 51 of the alignment key recognition device 50 between two circuit boards to be coupled, and therefore an interference between the fitting members B disposed on the circuit boards and the support member 51 can be suppressed.

Fourth Modification

In the embodiment and Modifications described above, the case where a set of the cross-shaped alignment key 31 and the alignment key 32 having four rectangle shapes with a cross-shaped gap is used as the pair of alignment keys, and the case where a set of the cross-shaped alignment keys 31 is used as the pair of alignment keys have been exemplified, but the present disclosure is not limited thereto.

Figure 16:
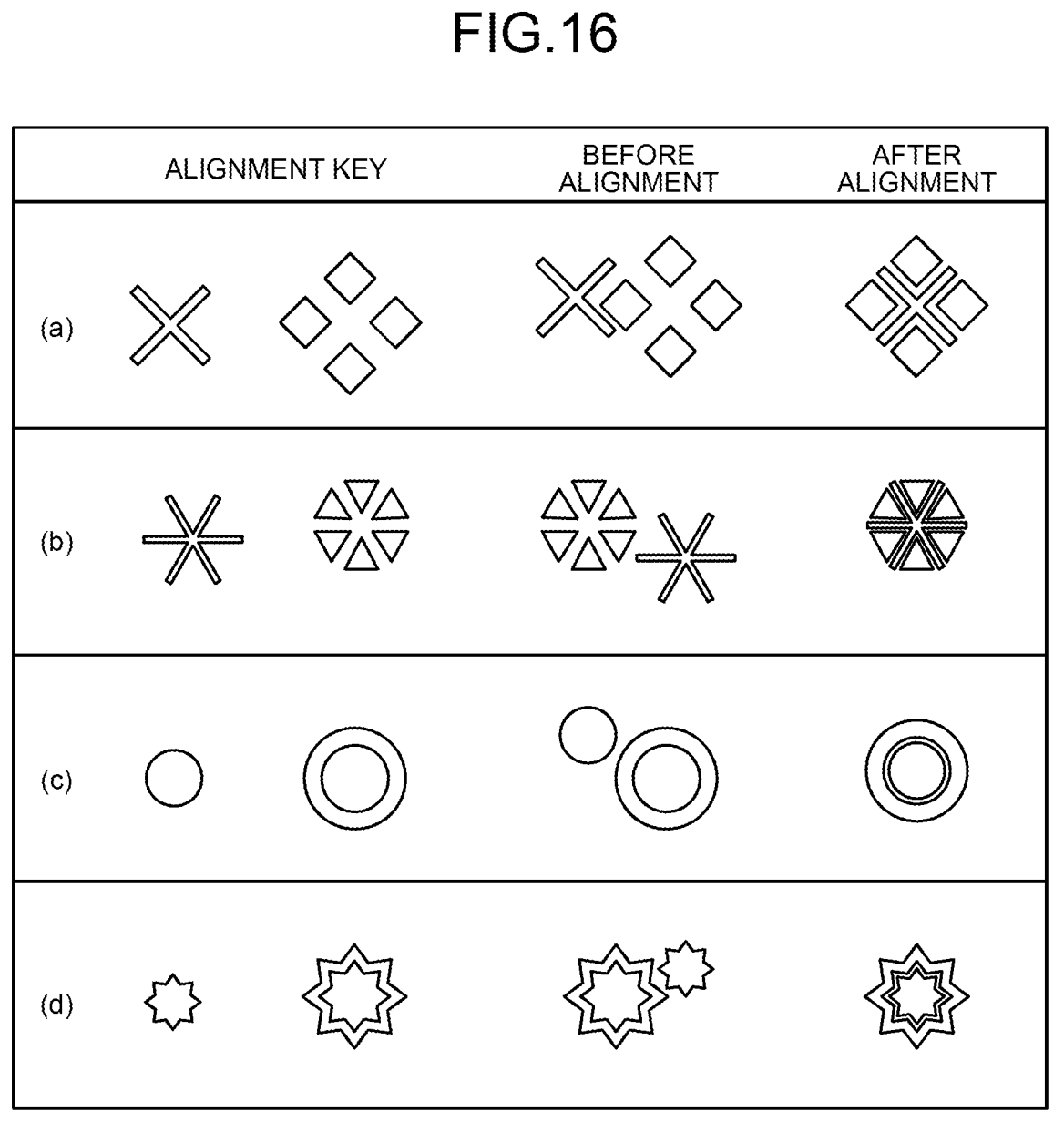

FIG. 16 is a diagram illustrating another example of the alignment key according to the embodiment. As illustrated in FIG. 16, various shapes can be used as the alignment key. For example, as illustrated in (a) of FIG. 16, the alignment key may have a shape in which each of the alignment keys 31 and 32 is rotated. For example, as illustrated in (b) of FIG. 16, the alignment keys may be a set of an * (asterisk) shape and six triangles with a gap having the asterisk shape. For example, as illustrated in (c) of FIG. 16, the alignment key may be a set of a circular or elliptical shape and a ring shape having a gap having the circular or elliptical shape. For example, as illustrated in (d) of FIG. 16, the alignment keys may be a set of a shape obtained by combining two rectangles and a shape with a gap having the shape obtained by combining the two rectangles. Note that the shape of the alignment key is not limited to the shapes illustrated in FIG. 16, and any polygonal shape such as a triangle or a quadrangle can be used.

As the alignment key, a through bore such as a through hole in which a conductive plating film formed on a circuit board is formed may be used. For example, one or both of the shapes of the alignment keys illustrated in (c) of FIG. 16 can be formed as through holes in a printed circuit board.

As the alignment key, the male fitting member Bm or the female fitting member itself disposed on a circuit board may be used. As an example, it is also possible to perform alignment so as to achieve alignment between the alignment key 31 and four elastic portions of the female fitting member Bf.

Even with these configurations, similar effects to those of the above-described embodiment can be obtained.

Fifth Modification

In the embodiment and Modifications described above, the description has been given focusing on coupling between two circuit boards, but the present disclosure is not limited thereto.

Figure 17:
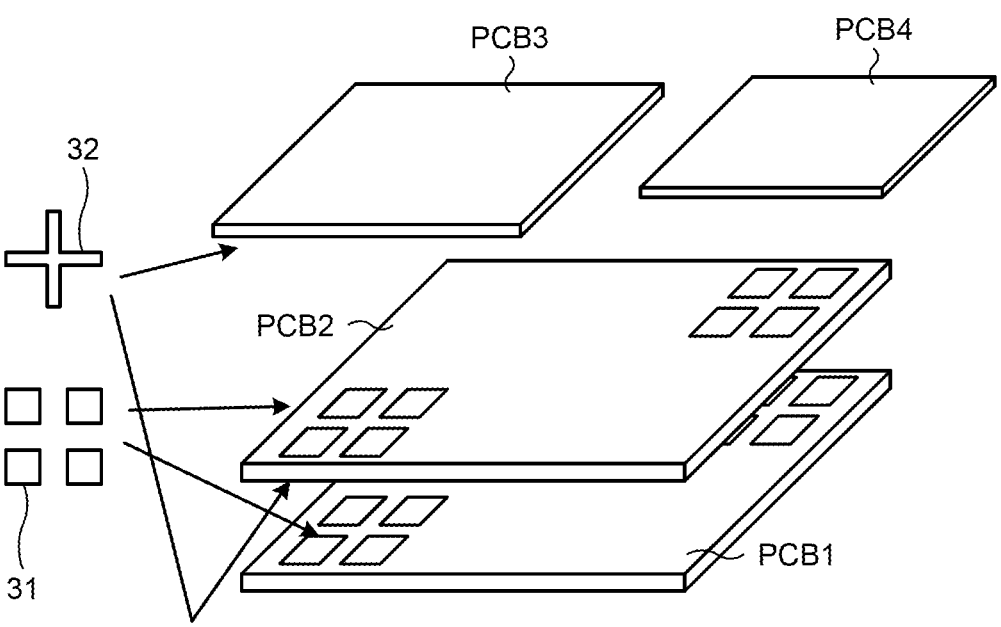
FIG. 17 is a schematic view illustrating another example of the inter-component connection according to the embodiment.

FIG. 17 is a schematic view illustrating another example of the inter-component connection according to the embodiment. As illustrated in FIG. 17, the technology according to the embodiment and Modifications described above can also be applied to a case where a plurality of circuit boards is coupled to one circuit board. In the example illustrated in FIG. 17, the second circuit board PCB2 is stacked on the first circuit board PCB1. The third circuit board PCB3 and the fourth circuit board PCB4 are stacked on the second circuit board PCB2. The coupling of the third circuit board PCB3 to the second circuit board PCB2 and the coupling of the fourth circuit board PCB4 to the second circuit board PCB2 only need to be performed in a similar manner to the inter-component connection described above. Note that when a plurality of circuit boards is coupled to one circuit board, the sizes of the circuit boards may be different from each other.

Note that the shape of the alignment key may be different for every two circuit boards to be coupled. For example, when a plurality of circuit boards is coupled to one circuit board, a circuit board to be coupled can be recognized by the shape of the alignment key.

Even with these configurations, similar effects to those of the above-described embodiment can be obtained. In addition, when a different alignment key is used for each circuit board to be coupled, the alignment key can be distinguished from an alignment key formed for coupling to another circuit board. Therefore, fitting position accuracy between fitting members in a fitting portion that electrically connects components to each other can be further improved.

Sixth Modification

Figure 18:
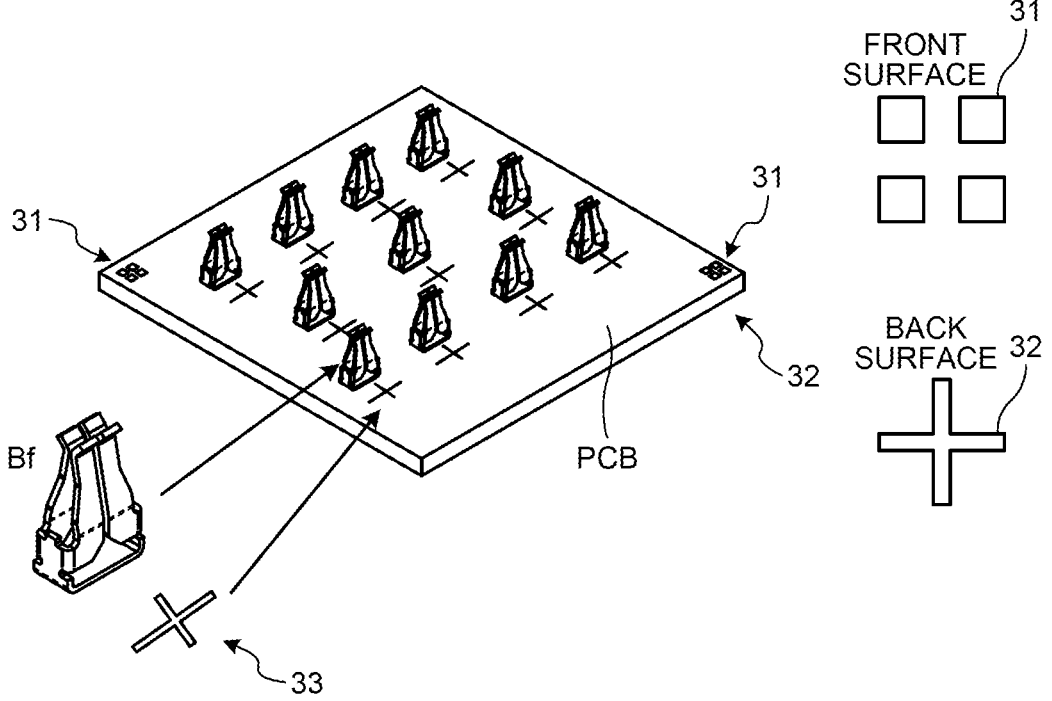
FIG. 18 is a schematic view illustrating another example of the inter-component connection according to the embodiment.
Figure 19:
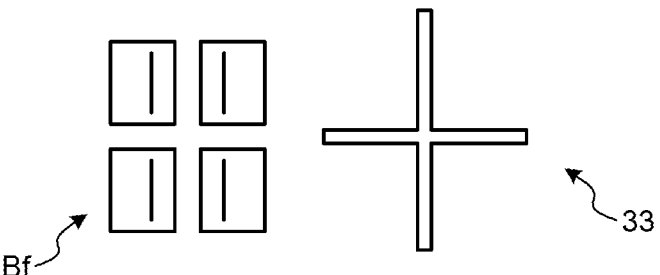
FIG. 19 is a diagram for describing an example of arrangement of a fitting member B in the inter-component connection according to the embodiment.

FIG. 18 is a schematic view illustrating another example of the inter-component connection according to the embodiment. FIG. 19 is a diagram for describing an example of arrangement of the fitting member B in the inter-component connection according to the embodiment.

As illustrated in FIG. 18, each circuit board may have an alignment key 33 for aligning the fitting member B on the circuit board. The alignment key 33 for arranging the fitting member B is formed with the alignment keys 31 and 32 of the circuit board as a reference position such as an origin. Here, each of the plurality of alignment keys 37 for alignment of the plurality of pairs of fitting members B is an example of a second alignment key. Each fitting member B is moved while a relative position thereof with respect to the alignment key 33 is confirmed with a camera or the like, and for example, as illustrated in FIG. 19, is soldered to a predetermined position with respect to the alignment key 33. FIGS. 18 and 19 exemplify a case where the female fitting member Bf is aligned such that the four elastic portions and the alignment key 33 are separated from each other by a predetermined distance and have the same inclination.

Figure 20:
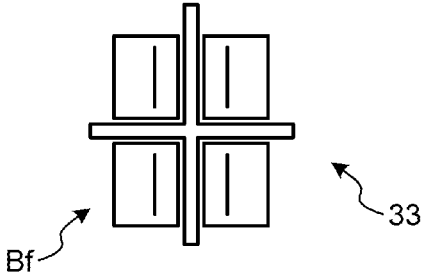
FIG. 20 is a diagram for describing another example of the arrangement of the fitting member B in the inter-component connection according to the embodiment.

Note that FIG. 19 exemplifies, as the predetermined position with respect to alignment key 33, a position separated from the alignment key 33 by a predetermined distance and having the same inclination. However, the present disclosure is not limited thereto. FIG. 20 is a diagram for describing another example of the arrangement of the fitting member B in the inter-component connection according to the embodiment. As illustrated in FIG. 20, the fitting member B can be arranged such that the four elastic portions and the alignment key 31 are aligned in a similar manner to the alignment using the alignment keys 32 and 33.

In addition, a configuration in which an alignment key corresponding to the alignment key 33 is formed in the fitting member B itself can be implemented. In this case, alignment is performed between the alignment key 33 and an alignment key formed on the fitting member B, and the fitting member B is arranged at a predetermined position on a circuit board.

Note that, in the present modification, the female fitting member Bf has been described as an example, but the male fitting member Bm can also be similarly arranged using the alignment key 33.

According to these configurations, in addition to the effects obtained by the above-described embodiment, it is possible to obtain an effect that positional accuracy regarding arrangement of the fitting member B can be improved.

Seventh Modification

Figure 21:
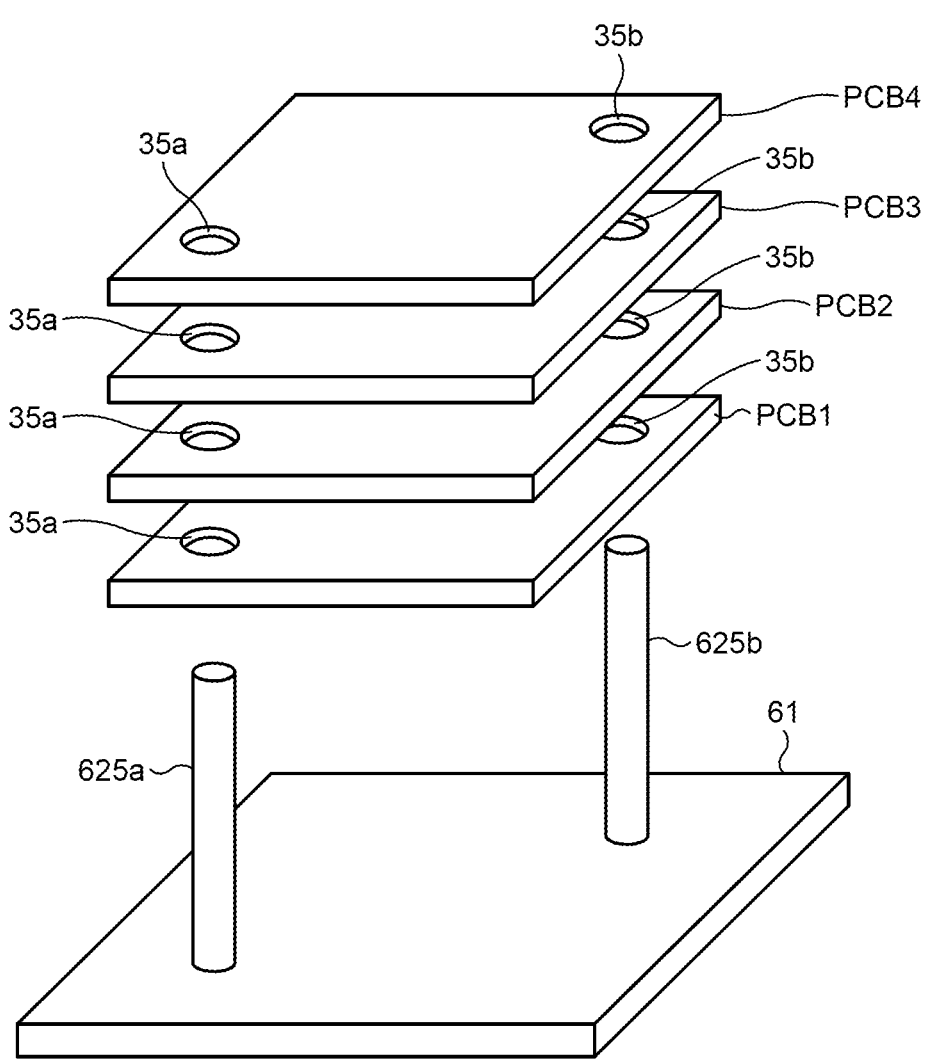
FIG. 21 is a schematic view illustrating another example of the inter-component connection according to the embodiment.
Figure 22:
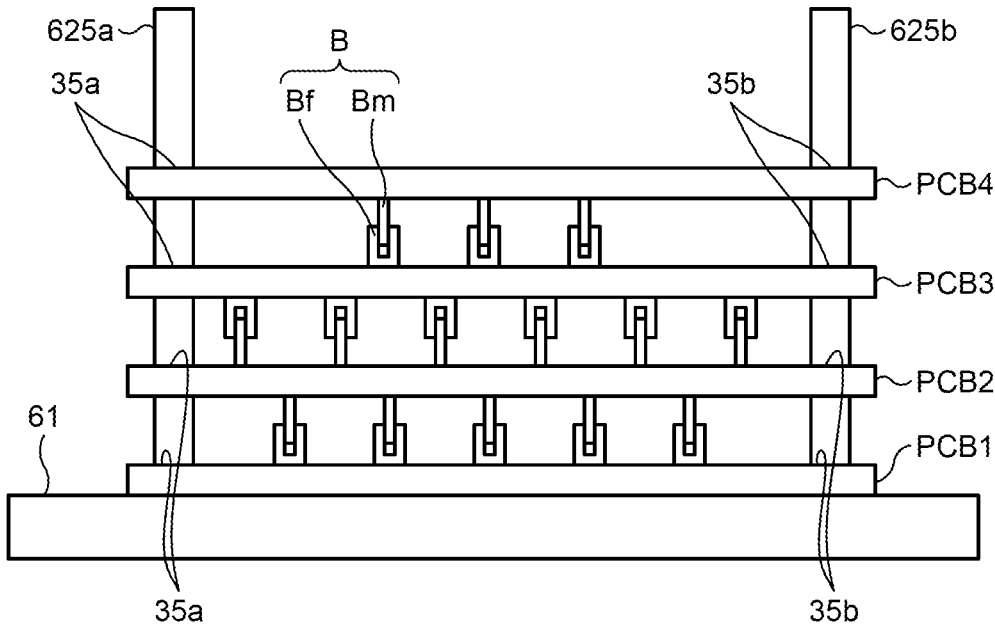
FIG. 22 is a schematic view illustrating another example of the inter-component connection according to the embodiment.

FIGS. 21 and 22 are schematic views illustrating another example of the inter-component connection according to the embodiment. FIG. 21 schematically illustrates a state before circuit boards are coupled to each other. FIG. 22 schematically illustrates a state in which circuit boards are coupled to each other.

The stage 61 according to the present modification is a part of a housing of the power converter 1. The housing has positioning pins 625*a* and 625*b* such as a dowel pin, a knock pin, and a parallel pin. Note that the positioning pins 625*a* and 625*b* are marks for position adjustment used at the time of alignment in a flow of coupling circuit boards to each other, and thus can be expressed as an example of a first alignment key. Each circuit board according to the present modification has holes 35*a* and 35*b* instead of the alignment keys 31 and 32. Note that the holes 35*a* and 35*b* are marks for position adjustment used at the time of alignment in a flow of coupling circuit boards to each other, and thus can be expressed as an example of a first alignment key. The holes 35*a* and 35*b* of each circuit board are formed at positions corresponding to the positioning pins 625*a* and 625*b* of the housing, respectively. The holes 35*a* and 35*b* of each circuit board have diameters slightly larger than the diameters of the positioning pins 625*a* and 625*b*. In each circuit board, the fitting member B is disposed with the holes 35*a* and 35*b* as reference positions.

The recognition control unit 411 according to the present modification recognizes the positioning pins 625*a* and 625*b* and the holes 35*a* and 35*b* with the alignment key recognition device 50. The movement control unit 413 moves each board in the horizontal direction on the basis of the recognition results of the positioning pins 625*a* and 625*b* and the holes 35*a* and 35*b* to complete alignment. After the alignment is completed, as illustrated in FIG. 22, the movement control unit 413 moves the boards in the vertical direction while causing the holes 35*a* and 35*b* of the boards to follow the positioning pins 625*a* and 625*b*, and sequentially couples the boards to each other.

As described above, even in a configuration using positioning pins 625a and 625b and holes 35a and 35b instead of alignment keys 31 and 32, it is possible to achieve good fitting of a fitting member B as in the above-described embodiment. That is, according to the configuration of the present modification, similarly to the above-described embodiment, it is possible to obtain an effect that positional accuracy regarding arrangement of the fitting member B can be improved.

Eighth Modification

Figure 23:
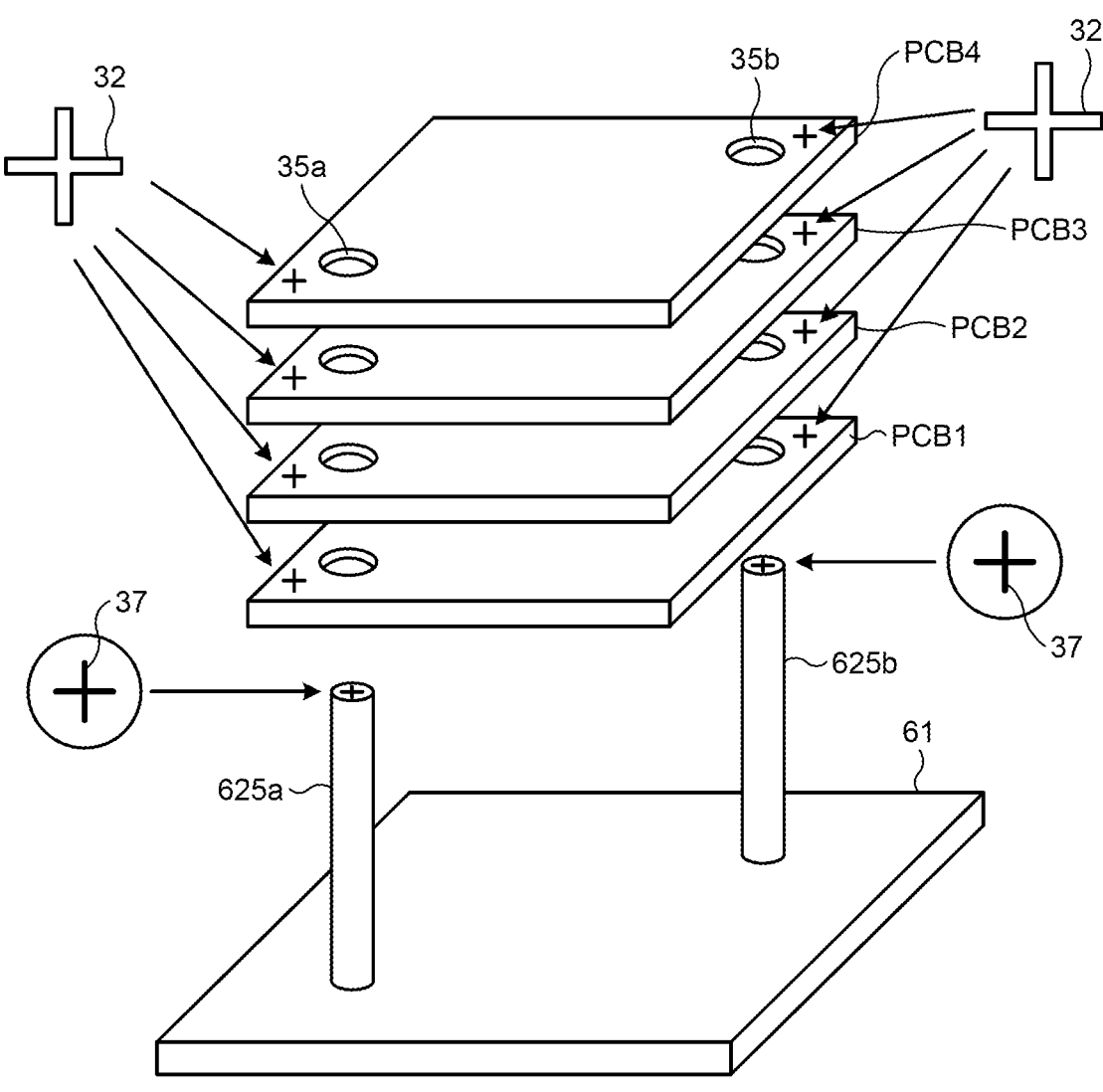
FIG. 23 is a schematic view illustrating another example of the inter-component connection according to the embodiment.
Figure 24:
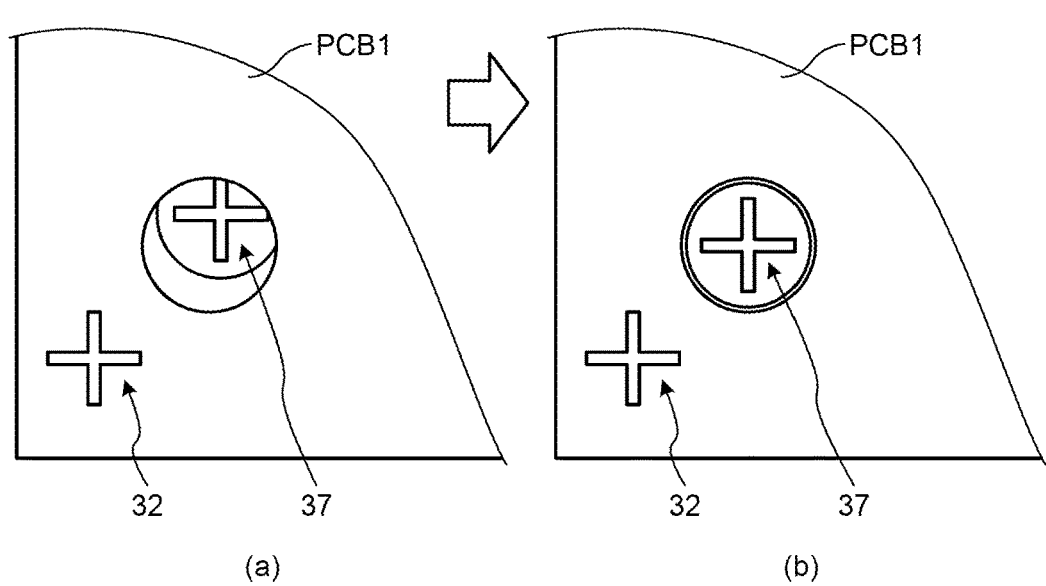
FIG. 24 is a diagram for describing an example of a positional relationship of alignment keys before and after alignment between components in the inter-component connection according to the embodiment.

FIG. 23 is a schematic view illustrating another example of the inter-component connection according to the embodiment. FIG. 23 schematically illustrates a state before circuit boards are coupled to each other. FIG. 24 is a diagram for describing an example of a positional relationship of alignment keys before and after alignment between components in the inter-component connection according to the embodiment.

The stage 61 according to the present modification is substantially similar to that of Seventh Modification. The stage 61 is a part of a housing of the power converter 1, and has the positioning pins 625a and 625b such as a dowel pin, a knock pin, and a parallel pin. Unlike Seventh Modification, an alignment keys 37 is formed on each of upper surfaces of the positioning pins 625a and 625b according to the present modification. Here, each of the pair of alignment keys 37 for alignment of two circuit boards to be coupled is an example of a first alignment key. Unlike Seventh Modification, each circuit board according to the present modification has the holes 35a and 35b in addition to the alignment key 32. The holes 35a and 35b of each circuit board are formed at positions corresponding to the positioning pins 625a and 625b of the housing, respectively. In each circuit board, the fitting member B is arranged with the holes 35a and 35b or the alignment keys 32 as reference positions.

The recognition control unit 411 according to the present modification recognizes the alignment key 32 formed on a circuit board and the alignment keys 37 formed on the positioning pins 625a and 625b with the alignment key recognition device 50. The movement control unit 413 moves each board in the horizontal direction on the basis of the recognition results of the alignment keys 32 and 37 to complete alignment. After the alignment is completed, similarly to the above-described embodiment, the movement control unit 413 moves each board in the vertical direction to sequentially couple the boards to each other.

Note that, in the configuration of the present modification, the shape of another alignment key such as the alignment key 31 may be appropriately used instead of the alignment key 32.

In Seventh Modification, the holes 35a and 35b having diameters slightly larger than the diameters of the positioning pins 625a and 625b have been exemplified in order to move the boards in the vertical direction while causing the holes 35a and 35b to follow the positioning pins 625a and 625b. Meanwhile, in the present modification, since the alignment key 37 is formed on each of upper surfaces of the positioning pins 625a and 625b, it is not necessary to move each board in the vertical direction while causing the holes 35a and 35b to follow the positioning pins 625a and 625b. Therefore, according to the configuration of the present modification, dimensional constraints of the holes 35a and

35b and the positioning pins 625a and 625b can be loosened as compared with the configuration of Seventh Modification.

Ninth Modification

Figure 25:
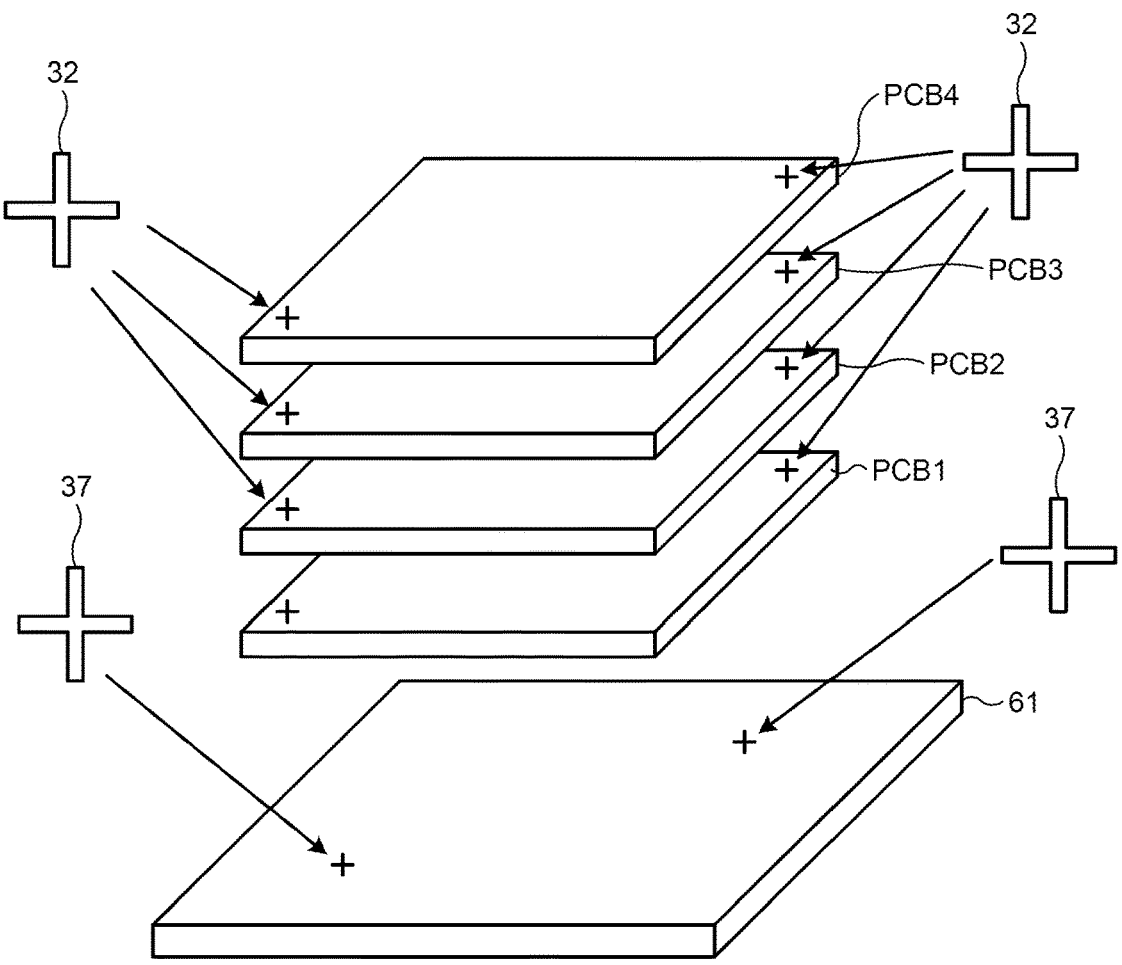
FIG. 25 is a schematic view illustrating another example of the inter-component connection according to the embodiment.

FIG. 25 is a schematic view illustrating another example of the inter-component connection according to the embodiment. As illustrated in FIG. 25, in the configuration according to Eighth Modification, the stage 61 as a part of a housing of the power converter 1 does not have to have the positioning pins 625a and 625b. In this case, as illustrated in FIG. 25, the alignment keys 37 are formed at the positions on the stage 61 where the positioning pins 625a and 625b are disposed in the configuration according to Eighth Modification.

According to this configuration, since alignment of a circuit board can be performed on the basis of the alignment keys 33 and 37, unlike the configuration according to Eighth Modification, the positioning pins 625a and 625b can be made unnecessary. Not disposing the positioning pins 625a and 625b contributes to reducing the number of components of the power converter 1 to reduce cost.

As described above, according to the inter-component connection structure, the power converter 1, the inter-component connection system 4, and the inter-component connection method according to the present disclosure, it is possible to improve fitting position accuracy between fitting members in a fitting portion that electrically connects components to each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An inter-component connection system for connecting components of a power converter to each other, wherein the power converter includes:

a first component in which one alignment key of a pair of first alignment keys is formed;

a second component in which the other alignment key of the pair of first alignment keys is formed; and a plurality of pairs of fitting members each including:

a male fitting member having an insertion portion; and a female fitting member having a first clamping portion and a second clamping portion arranged so as to face each other, wherein in each of the plurality of pairs of fitting members, the male fitting member is arranged on one of the first component and the second component, with the first alignment key as a reference position, and the female fitting member is arranged on the other of the first component and the second component, with the first alignment key as a reference position, the first component and the second component are coupled to each other by the female fitting member clamping the insertion portion of the male fitting member inserted between the first clamping portion and the second clamping portion in each of the plurality of pairs of fitting members in a state where the pair of first alignment keys are positionally aligned, the first clamping portion and the second clamping portion are each bent so as to form one of protrusions toward one of surfaces thereof facing each other, and a gap is formed in a distal end portion of each of the first clamping portion and the second clamping portion, wherein the inter-component connection system comprises:

a plurality of cameras that image the first component and the second component;

a moving device that changes a relative position of the second component with respect to the first component;

a memory; and a hardware processor coupled to the memory, the hardware processor being configured to:

control the plurality of cameras and recognize each of the pair of first alignment keys; and control the moving device, and change a relative position of the second component with respect to the first component until the pair of first alignment keys are positionally aligned based on a recognition result of the pair of first alignment keys.

2. The inter-component connection system according to claim 1, wherein the pair of first alignment keys are formed on surfaces of the first component and the second component, the surfaces facing each other.

3. The inter-component connection system according to claim 1, wherein the pair of first alignment keys are formed on surfaces of the first component and the second component, the surfaces facing the same side.

4. The inter-component connection system according to claim 1, wherein the first alignment keys have pattern shapes formed in the first component and the second component.

5. The inter-component connection system according to claim 1, wherein the pair of first alignment keys have identical pattern shapes.

6. The inter-component connection system according to claim 1, wherein one of the pair of first alignment keys is at least two positioning pins disposed in the first component, and the other of the pair of first alignment keys is at least two holes formed in the second component.

7. The inter-component connection system according to claim 1, wherein one of the pair of first alignment keys has a pattern shape formed on a surface of each of at least two positioning pins disposed in the first component, the surface facing the second component, and the other of the pair of first alignment keys has a pattern shape formed near each of at least two holes formed in the second component.

8. The inter-component connection system according to claim 1, wherein a plurality of second alignment keys are further formed with the first alignment keys as reference positions in the first component and the second component, and each of the male fitting member and the female fitting member is disposed at a position corresponding to one of the plurality of second alignment keys.

9. The inter-component connection system according to claim 1, wherein the power converter further-comprising includes:

a third component to be coupled to the second component, wherein each of the pair of first alignment keys is further formed on one of the second component and the third component, the plurality of pairs of fitting members are further disposed on the second component and the third component, and in each of the plurality of pairs of fitting members arranged on the second component and the third component, the male fitting member is disposed on one of the second component and the third component, with the first alignment key as a reference position, and the female fitting member is disposed on the other of the second component and the third component, with the first alignment key as a reference position.

10. The inter-component connection system according to claim 1, wherein the insertion portion of the male fitting member has a substantially flat plate shape.

11. An inter-component connection method comprising:

forming one alignment key of a pair of first alignment keys in a first component;

forming the other alignment key of the pair of first alignment keys in a second component;

arranging a plurality of pairs of fitting members each including:

a male fitting member having an insertion portion; and a female fitting member having a first clamping portion and a second clamping portion to be arranged so as to face each other, in the first component and the second component with each of the pair of alignment keys as a reference position such that the male fitting member and the female fitting member in each of the plurality of pairs of fitting members are arranged on different components;

recognizing the pair of alignment keys;

changing a relative position of the second component with respect to the first component until the pair of alignment keys are positionally aligned based on a recognition result of the pair of alignment keys;

controlling a plurality of cameras that image the first component and the second component to recognize each of the pair of first alignment keys;

controlling a moving device to change a relative position of the second component with respect to the first component until the pair of first alignment keys are positionally aligned based on a recognition result of the pair of first alignment keys; and coupling the first component and the second component to each other by the female fitting member clamping the insertion portion of the male fitting member inserted between the first clamping portion and the second clamping portion in each of the plurality of pairs of fitting members in a state where the pair of first alignment keys are positionally aligned, wherein the first clamping portion and the second clamping portion are each bent so as to form one of protrusions toward one of surfaces thereof facing each other, and a gap is formed in a distal end portion of each of the first clamping portion and the second clamping portion.

* * * * *